US012027450B2

(12) United States Patent
Tsuchiyama et al.

(10) Patent No.: US 12,027,450 B2
(45) Date of Patent: Jul. 2, 2024

(54) ELECTRONIC DEVICE AND ELECTRONIC DEVICE MOUNTING STRUCTURE

(71) Applicant: ROHM CO., LTD., Kyoto (JP)

(72) Inventors: Toshiro Tsuchiyama, Kyoto (JP); Yasumasa Kasuya, Kyoto (JP); Tatsuo Yamazaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 330 days.

(21) Appl. No.: 17/596,414

(22) PCT Filed: Jun. 25, 2020

(86) PCT No.: PCT/JP2020/025022
§ 371 (c)(1),
(2) Date: Dec. 9, 2021

(87) PCT Pub. No.: WO2020/262533
PCT Pub. Date: Dec. 30, 2020

(65) Prior Publication Data
US 2022/0310491 A1 Sep. 29, 2022

(30) Foreign Application Priority Data

Jun. 28, 2019 (JP) .................................. 2019-121339

(51) Int. Cl.
*H01L 23/495* (2006.01)
*H01L 23/00* (2006.01)
*H01L 23/31* (2006.01)

(52) U.S. Cl.
CPC .... *H01L 23/49541* (2013.01); *H01L 23/3107* (2013.01); *H01L 23/49503* (2013.01);
(Continued)

(58) Field of Classification Search
CPC ........... H01L 23/49541; H01L 23/3107; H01L 23/49503; H01L 24/48; H01L 24/45
See application file for complete search history.

(56) References Cited

U.S. PATENT DOCUMENTS

2016/0007464 A1* 1/2016 Matsubara ............ H01L 23/564
361/783
2019/0333885 A1* 10/2019 Saito ................. H01L 23/49548

FOREIGN PATENT DOCUMENTS

JP     2008-288304 A     11/2008
JP     2010-258159 A     11/2010
(Continued)

OTHER PUBLICATIONS

International Search Report issued in PCT/JP2020/025022, Sep. 8, 2020 (2 pages).
(Continued)

*Primary Examiner* — Marc Anthony Armand
(74) *Attorney, Agent, or Firm* — HSML P.C.

(57) ABSTRACT

An electronic device includes: an electronic element having an element obverse surface and an element reverse surface spaced apart from each other in a first direction, the element obverse surface being provided with an obverse-surface electrode; a resin member having a resin reverse surface facing in a same direction as the element reverse surface, the resin member covering the electronic element; and an electrically conductive member supporting the electronic element and electrically connected to the electronic element. The electrically conductive member has a first exposed region, a second exposed region and a third exposed region each of which is exposed from the resin reverse surface. The resin member has a first resin side surface and a second resin side surface connected to each other and standing up from the resin reverse surface. As viewed in the first direction, the first exposed region is located at a corner portion where the first resin side surface and the second resin side surface are connected. As viewed in the first direction, the second exposed region is located side by side with the first exposed region in a second direction extending along the first resin side surface. The third exposed region is located between the (Continued)

first exposed region and the second exposed region in the second direction. As viewed in the first direction, the third exposed region has a larger area than each of the first exposed region and the second exposed region.

20 Claims, 15 Drawing Sheets

(52) U.S. Cl.
CPC .............. *H01L 24/48* (2013.01); *H01L 24/45* (2013.01); *H01L 2224/45124* (2013.01); *H01L 2224/45144* (2013.01); *H01L 2224/45147* (2013.01); *H01L 2224/48177* (2013.01)

(56) References Cited

FOREIGN PATENT DOCUMENTS

| | | | |
|---|---|---|---|
| JP | 2013-239740 | A | 11/2013 |
| JP | 2016-27614 | A | 2/2016 |
| JP | 2018-10935 | A | 1/2018 |

OTHER PUBLICATIONS

Office Action received in the corresponding Japanese Patent application, Jan. 9, 2024, and machine translation (8 pages).

\* cited by examiner

ELECTRONIC DEVICE AND ELECTRONIC DEVICE MOUNTING STRUCTURE

TECHNICAL FIELD

The present disclosure relates to an electronic device and a mounting structure of the electronic device.

BACKGROUND ART

Semiconductor devices of various types have been known. For example, Patent Document 1 discloses a semiconductor device that includes a semiconductor chip, a die pad, a plurality of leads and a sealing resin. The semiconductor chip is placed on the die pad. The sealing resin covers the semiconductor chip, the die pad and the leads. This semiconductor device is for mounting onto a circuit board by soldering. The leads have portions exposed from the sealing resin, so that solder joints will be formed on the exposed portions.

PRIOR ART DOCUMENT

Patent Document

Patent Document 1: JP-A-2013-239740

SUMMARY OF THE INVENTION

Problem to be Solved by the Invention

During operation of the semiconductor device, the components of the device are subjected to thermal expansion and contraction repeatedly. This may cause cracking of solder joints connected to the leads.

In view of the circumstances described above, one object of the present disclosure is to provide an electronic device and an assembled structure of the electronic device each of which is configured to prevent cracking of a solder joint layer.

Means to Solve the Problem

An aspect of the present disclosure provides an electronic device including: an electronic element having an element obverse surface and an element reverse surface spaced apart from each other in a first direction, with the element obverse surface being provided with an obverse-surface electrode; a resin member having a resin reverse surface facing in a same direction as the element reverse surface, the resin member covering the electronic element; and an electrically conductive member supporting the electronic element and electrically connected to the electronic element. The electrically conductive member has a first exposed region, a second exposed region and a third exposed region each of which is exposed from the resin reverse surface. The resin member has a first resin side surface and a second resin side surface connected to each other and standing up from the resin reverse surface. As viewed in the first direction, the first exposed region is located at a corner portion where the first resin side surface and the second resin side surface are connected. As viewed in the first direction, the second exposed region is located side by side with the first exposed region in a second direction extending along the first resin side surface. The third exposed region is located between the first exposed region and the second exposed region in the second direction. As viewed in the first direction, the third exposed region has a larger area than each of the first exposed region and the second exposed region.

Advantages of Invention

The electronic device and the mounting structure of the electronic device according to the present disclosure can prevent cracking of the solder layer.

MODE FOR CARRYING OUT THE INVENTION

With reference to the drawings, the following describes preferred embodiments of an electronic device and an assembled structure of the electronic device according to the present disclosure. The same or similar components are denoted by the same reference signs, and a description of such a component is not repeated.

FIGS. 1 to 8 show an electronic device A1 according to a first embodiment. The electronic device A1 is configured to be surface mountable. The electronic device A1 includes an electronic element 1, a resin member 2, a lead frame 3 and a plurality of connecting members 51 to 54.

Figure 1:
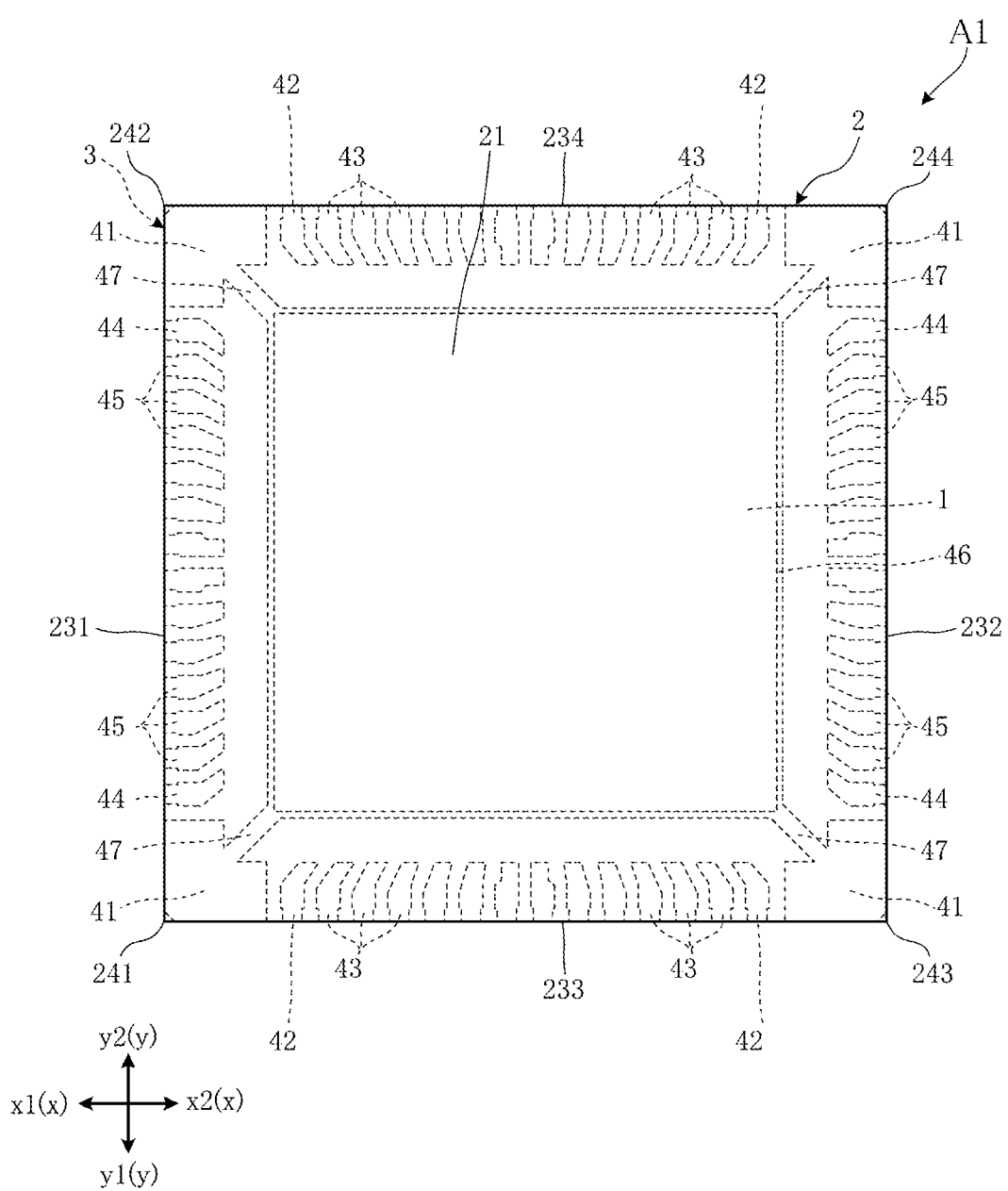
FIG. 1 is a plan view of an electronic device according to a first embodiment.
Figure 2:
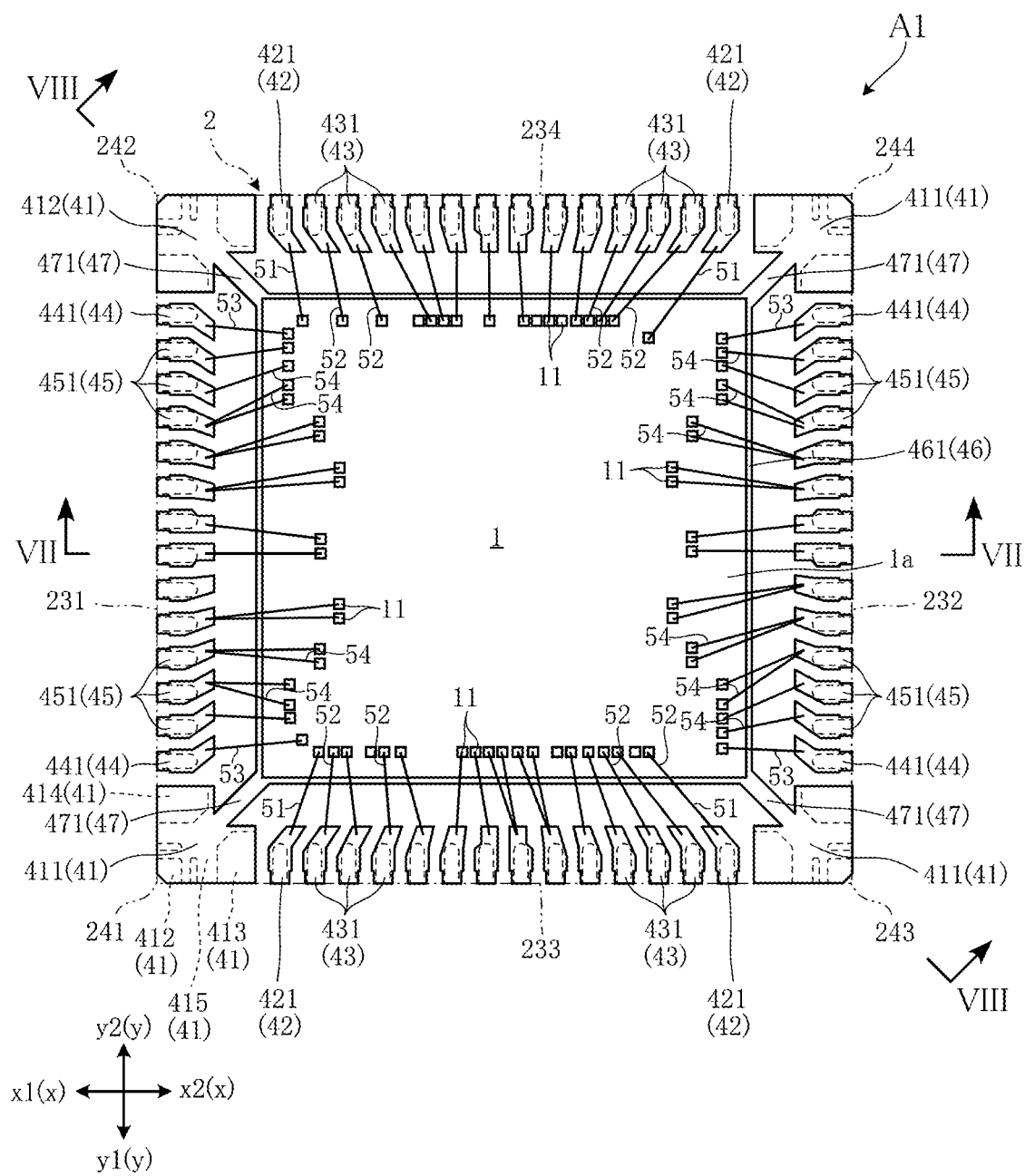
FIG. 2 is a plan view of the electronic device of FIG. 1, with a resin member shown in phantom.
Figure 3:
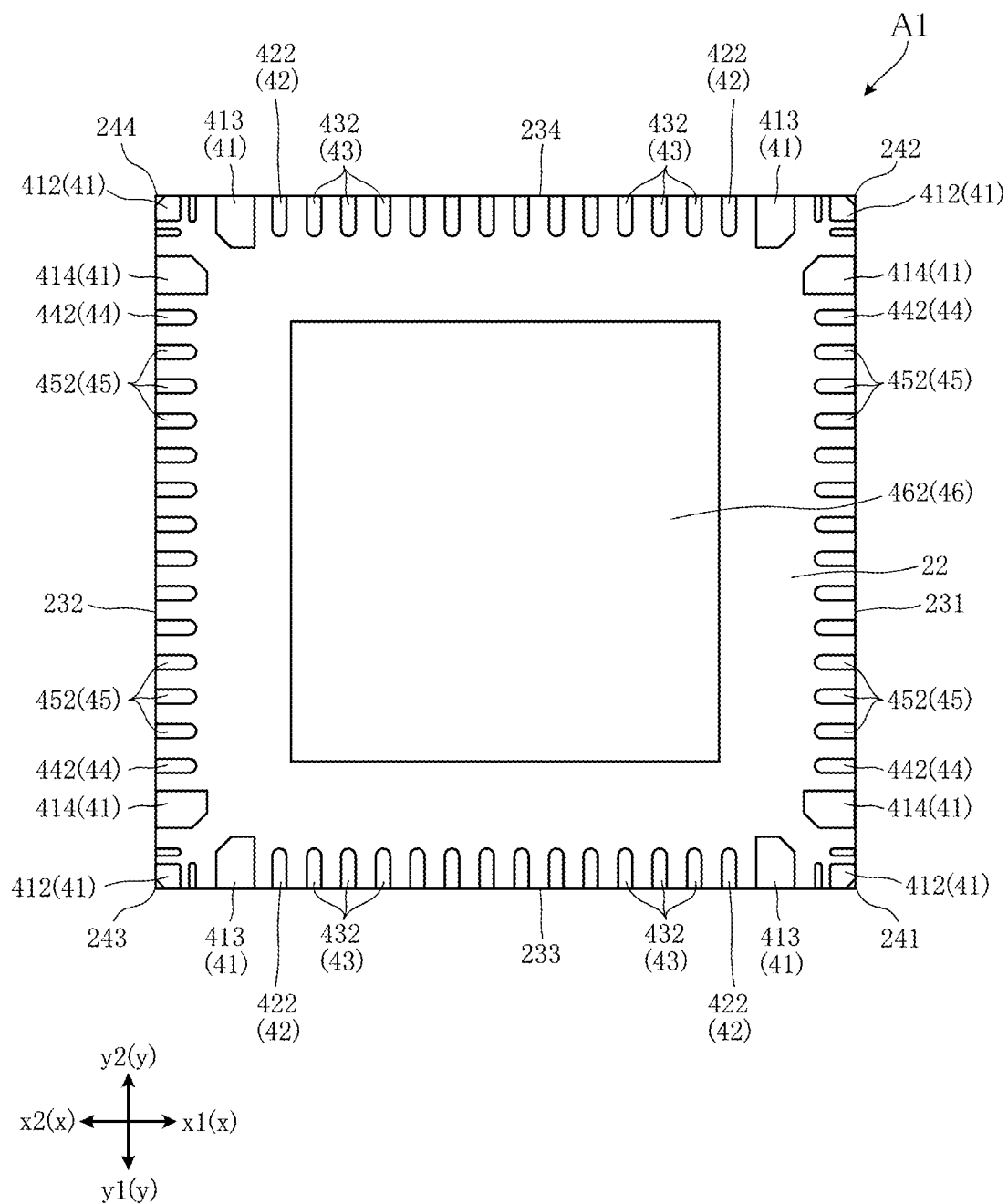
FIG. 3 is a bottom view of the electronic device according to the first embodiment.
Figure 4:
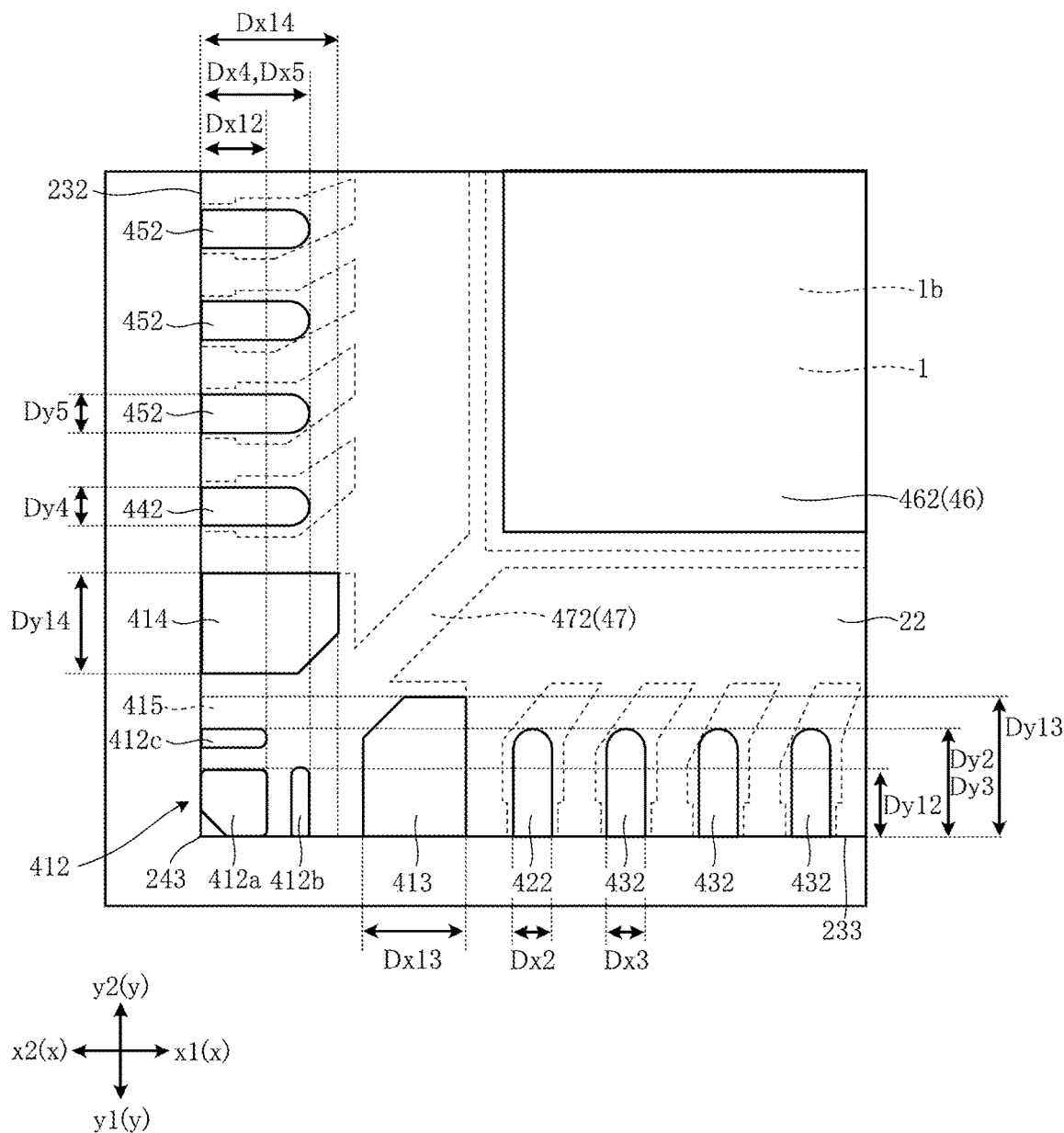
FIG. 4 is an enlarged view showing a portion of FIG. 3.
Figure 5:
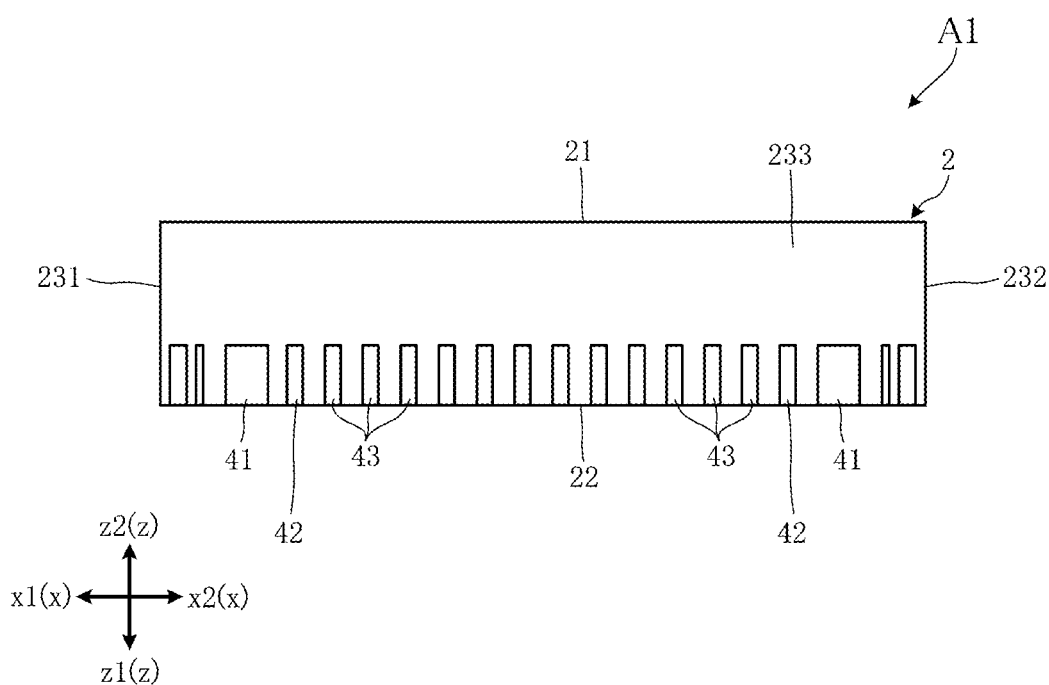
FIG. 5 is a front view of the electronic device according to the first embodiment.
Figure 6:
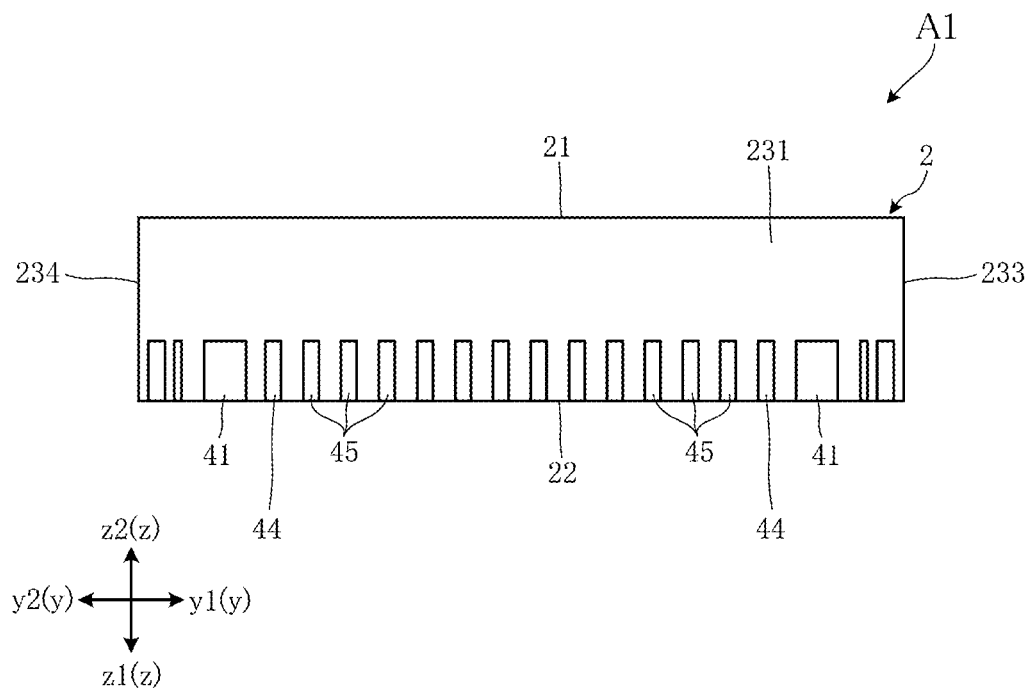
FIG. 6 is a side view (left side) of the electronic device according to the first embodiment.
Figure 7:
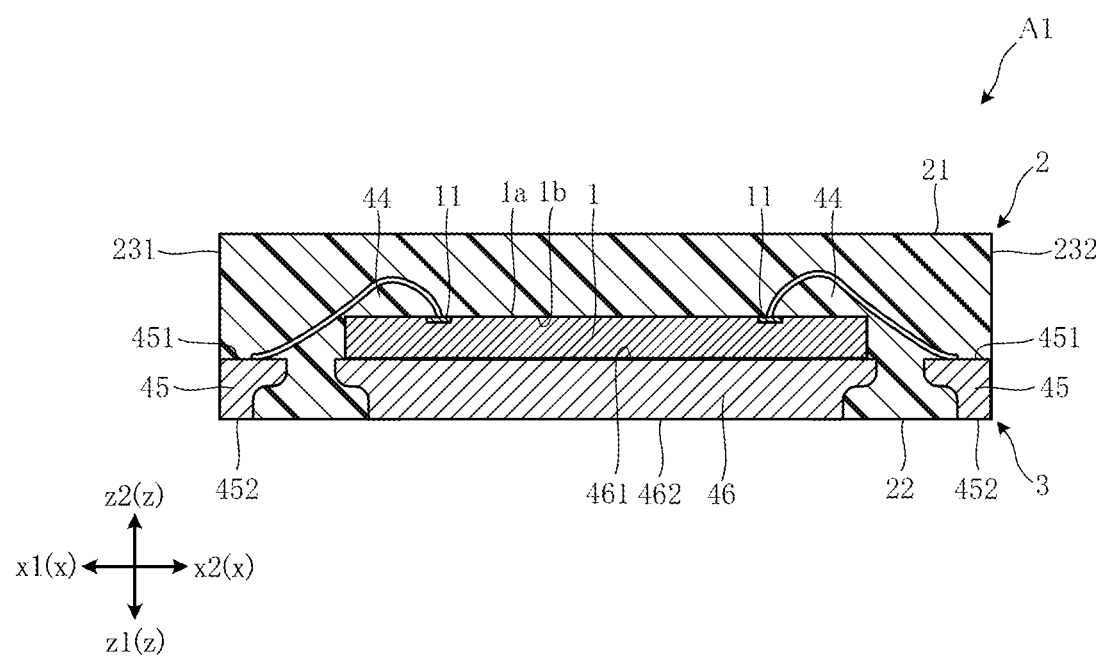
FIG. 7 is a sectional view taken along line VII-VII of FIG. 2.
Figure 8:
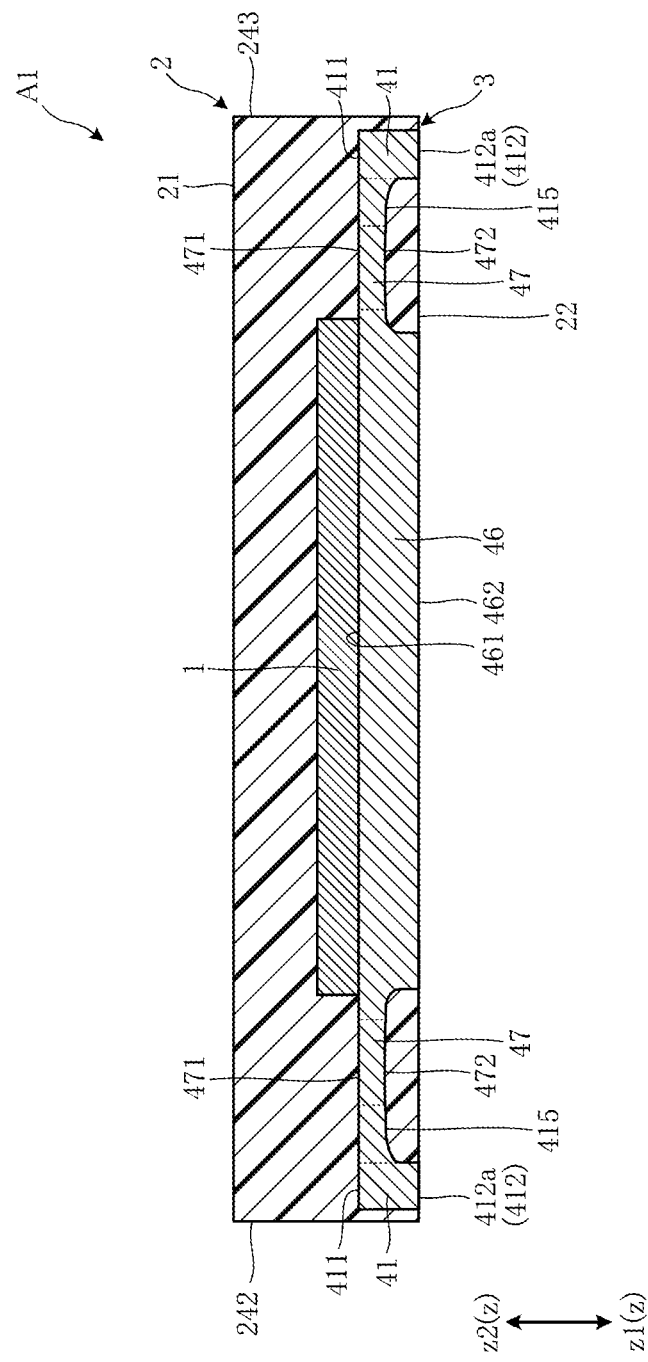
FIG. 8 is a sectional view taken along line VIII-VIII of FIG. 2.

FIG. 1 is a plan view of the electronic device A1. FIG. 2 is a plan view similar to FIG. 1, with the resin member 2 shown in phantom (chain double-dashed lines). FIG. 3 is a bottom view of the electronic device A1. FIG. 4 is an enlarged view showing a portion of FIG. 3. FIG. 5 is a front view of the electronic device A1. FIG. 6 is a side view (left side) of the electronic device A1. FIG. 7 is a sectional view taken along line VII-VII in FIG. 2. FIG. 8 is a sectional view taken along line VIII-VIII of FIG. 2.

For convenience of description, three mutually perpendicular directions are defined as x, y and z directions. The z direction corresponds to the thickness direction of the electronic device A1. The x direction corresponds to the horizontal direction in plan view of the electronic device A1 (see FIG. 1). The y direction corresponds to the vertical direction in plan view of the electronic device A1 (see FIG. 1). In addition, one side in the x direction is defined as x1 direction, and the other side as x2 direction. Similarly, one side in the y direction is defined as y1 direction, and the other side as y2 direction. One side in the z direction is defined as z1 direction, and the other side as z2 direction. In the description below, the term "plan view" refers to a view as seen in the z direction.

The electronic device A1 is provided in a package structure called an MAP (Molded Array Packaging) or a QFN (Quad Flat Non-leaded package). The electronic device A1 is for mounting onto a circuit board of an electronic device. The electronic device A1 may be rectangular in plan view. The electronic device A1 has an x-direction dimension and a y-direction dimension each of which measures from 2.9 to 10.1 mm, for example. The electronic device A1 has a z-direction dimension (thickness) measuring from 0.5 to 2.0 mm, for example.

The electronic element 1 is a component where the electrical function of the electronic device A1 is performed. The electronic element 1 may be an integrated circuit element, an active functional element or a passive functional element. The electronic element 1 may be a semiconductor element made from a semiconductor material. The electronic element 1 may be rectangular in plan view.

As shown in FIGS. 7 and 8, the electronic element 1 has an element obverse surface 1a and an element reverse surface 1b. The element obverse surface 1a and the element reverse surface 1b are spaced apart in the z direction and face away from each other. The element obverse surface 1a faces in the z2 direction, and the element reverse surface 1b in the z1 direction.

As shown in FIGS. 2 and 7, the electronic element 1 has a plurality of obverse-surface electrodes 11 disposed on the element obverse surface 1a. The number, layout, shapes and dimensions in plan view of the obverse-surface electrodes 11 are not limited to the specific example shown in FIG. 1. The details of the obverse-surface electrodes 11 may vary depending on the electronic element 1 used.

The electronic element 1 is bonded to the lead frame 3 (a mount part 46 described later) by, for example, a bonding material. The bonding material may be electrically insulative or conductive. For the electronic element 1 having a reverse-surface electrode on the element reverse surface 1b, an electrically bonding material is used to bond the electronic element 1 to the lead frame 3.

The resin member 2 is a sealing material that protects the electronic element 1. The resin member 2 is made from an insulating resin material, such as a black epoxy resin. The resin member 2 covers the electronic element 1, portions of the lead frame 3, and a plurality of connecting members 51 to 54. The resin member 2 is rectangular in plan view. The resin member 2 has a resin obverse surface 21, a resin reverse surface 22 and a plurality of resin side surfaces 231 to 234.

As shown in FIGS. 5 to 8, the resin obverse surface 21 and the resin reverse surface 22 are spaced apart in the z direction and face away from each other. The resin obverse surface 21 faces in the z2 direction, and the resin reverse surface 22 in the z1 direction.

Each of the resin side surfaces 231 to 234 is located between the resin obverse surface 21 and the resin reverse surface 22 in the z direction, connecting both the surfaces. Each of the resin side surfaces 231 to 234 stands up from the resin reverse surface 22 at a predetermined angle, which is 90° in this embodiment. The resin side surfaces 233 and 234 (first resin side surfaces) are spaced apart in the y direction and face away from each other. The resin side surface 233 faces in the y1 direction, and the resin side surface 234 in the y2 direction. The resin side surfaces 231 and 232 (second resin side surfaces) are spaced apart in the x direction and face away from each other. The resin side surface 231 faces in the x1 direction, and the resin side surface 232 in the x2 direction.

The resin side surfaces 231 and 233 are connected to each other and perpendicular to each other in plan view. Similarly, each two adjacent side surfaces, namely, the resin side surfaces 231 and 234, the resin side surfaces 232 and 233, the resin side surfaces 232 and 234 are connected to each other and perpendicular to each other in plan view. A region including the corner where in plan view the resin side surfaces 231 and 233 are connected and a vicinity of the corner is defined as a corner portion 241. A region including the corner where in plan view the resin side surfaces 231 and 234 are connected and a vicinity of the corner is defined as a corner portion 242. A region including the corner where in plan view the resin side surfaces 232 and 233 are connected and a vicinity of the corner is defined as a corner portion 243. A region including the corner where in plan view the resin side surfaces 232 and 234 are connected and a vicinity of the corner is defined as a corner portion 244.

The lead frame 3 supports the electronic element 1 and is electrically connected to the electronic element 1. The lead frame 3 has portions exposed from the resin member 2, and these exposed portions serve as the terminals of the electronic device A1. The lead frame 3 is made of a metal. Examples of the metal include copper, a copper alloy, nickel, a nickel alloy and Alloy 42. The lead frame 3 is fabricated by etching a metal plate, for example. In another example, the lead frame 3 may be fabricated by mechanically processing a metal plate, such as by stamping and/or bending. The lead frame 3 has a z-direction dimension (thickness) measuring from 0.08 to 0.5 mm, for example. Note that this thickness of the lead frame 3 is measured at a portion other than thin-portions.

The lead frame 3 includes a plurality of first terminal parts 41, a plurality of second terminal parts 42, a plurality of third terminal parts 43, a plurality of fourth terminal parts 44, a plurality of fifth terminal parts 45, a mount part 46 and a plurality of connecting parts 47. The first terminal parts 41, the mount part 46 and the connecting parts 47 are integrally formed as a single lead. The other terminals (the second terminal parts 42, the third terminal parts 43, the fourth terminal parts 44 and the fifth terminal part 45) are separated from the single lead. The second terminal parts 42, the third terminal parts 43, the fourth terminal parts 44 and the fifth terminal part 45 are also separated from each other.

As shown in FIGS. 1 to 3, the first terminal parts 41 are located at the four corner portions 241 to 244 of the electronic device A1 in plan view. Specifically, one of the first terminal parts 41 is located at the corner portion 241 where the resin side surfaces 231 and 233 are connected, another one is located at the corner portion 242 where the resin side surfaces 231 and 234 are connected, another one is located at the corner portion 243 where the resin side surfaces 232 and 233 are connected, and another one is located at the corner portion 244 where the resin side surfaces 232 and 234 are connected. None of the connecting members 51 to 54 is connected to the first terminal parts 41. The first terminal parts 41 is therefore electrically isolated from the obverse-surface electrode 11 of the electronic element 1. In this embodiment, the first terminal parts 41 have been cut away in the z direction to remove portions that overlap with the corner portion 241 to 244 in plan view. In another embodiment, such cut-away portions are not necessary.

Each first terminal part 41 has an obverse surface 411, a plurality of exposed regions 412, 413 and 414, and a covered region 415.

The obverse surface 411 is a flat surface facing in the z2 direction. In plan view, the obverse surface 411 has an L-shape.

The exposed regions 412, 413 and 414 are flat surfaces facing in the z1 direction. The exposed regions 412, 413 and 414 are exposed from the resin reverse surface 22. The exposed regions 412 are located at the corner portions 241 to 244. Each exposed region 412 has a main part 412a and a pair of sub-parts 412b and 412c. The main part 412a is rectangular in plan view. The main part 412a is located at a corresponding one of the corner portions 241 to 244. In plan view, the sub-part 412b is adjacent to the main part 412a in the x direction and has a band shape extending in the y direction. In plan view, the sub-part 412c is adjacent to the main part 412a in the y direction and has a band shape extending in the x direction. The exposed region 413 is adjacent to the exposed region 412 in the x direction, in particular to the sub-part 412b of the exposed region 412 in the x direction. That is, the sub-part 412b is located between the main part 412a and the exposed region 413 in the x direction. The exposed region 414 is adjacent to the exposed region 412 in the y direction, and in particular to the sub-part 412c of the exposed region 412 in the y direction. That is, the sub-part 412c is located between the main part 412a and the exposed region 414 in the y direction. The covered region 415 is a flat surface facing in the z1 direction.

The covered region 415 is covered by the resin member 2. In plan view, the covered region 415 has a portion located between the two exposed regions 412 and 413, a portion between the two exposed regions 412 and 414, and a portion between the exposed region 412 and the connecting part 47.

As shown in FIGS. 1 to 3, each second terminal part 42 is located between two first terminal parts 41 in the x direction and adjacent to one of the first terminal parts 41 in the x direction. The second terminal parts 42 include those extending from the resin side surface 233 into the resin member 2 in the y direction in plan view and those extending from the resin side surface 234 into the resin member 2 in the y direction in plan view. The second terminal parts 42 are exposed from the resin side surface 233 or 234. FIG. 5 shows two second terminal parts 42 exposed from the resin side surface 233.

Each second terminal part 42 has an obverse surface 421 and an exposed region 422. The obverse surface 421 and the exposed region 422 are spaced apart in the z direction and face away from each other. The obverse surface 421 faces in the z2 direction, and the exposed region 422 in the z1 direction. The obverse surface 421 has a connecting member 51 bonded thereto. As shown in FIG. 3, the exposed region 422 has a band shape extending in the y direction from the resin side surface 233 or 234. The exposed region 422 overlaps with the obverse surface 421 in plan view.

As shown in FIGS. 1 to 3, each third terminal part 43 is located between two second terminal parts 42 adjacent in the x direction. The third terminal parts 43 include those located along the resin side surface 233 in plan view to be exposed from the resin side surface 233, and those located along the resin side surface 234 in plan view to be exposed from the resin side surface 234. FIG. 2 shows an example in which 12 third terminal parts 43 are provided along each of the resin side surfaces 233 and 234. However, the number of the third terminal parts 43 provided along each of the resin side surfaces 233 and 234 is not limited to 12. The number of the third terminal parts 43 may range from 2 to 30, for example. As above, the third terminal parts 43 are exposed from the resin side surface 233 or 234. FIG. 5 shows 12 third terminal parts 43 exposed from the resin side surface 233.

Each third terminal part 43 has an obverse surface 431 and an exposed region 432. The obverse surface 431 and the exposed region 432 are spaced apart in the z direction and face away from each other. The obverse surface 431 faces in the z2 direction, and the exposed region 432 in the z1 direction. The obverse surface 431 has a connecting member 52 bonded thereto. As shown in FIG. 3, the exposed region 432 has a band shape extending in the y direction from either the resin side surface 233 or 234. The exposed region 432 overlaps with the obverse surface 431 in plan view.

As shown in FIGS. 3 and 4, each exposed region 412 is adjacent to an exposed region 413 in the x direction. The exposed region 413 is adjacent to an exposed region 422 in the x direction (at the side away from the exposed region 412). The exposed region 422 is adjacent to a subset of exposed region 432 in the x direction (at a side away from the exposed region 413). That is, as shown in FIG. 3, the exposed regions provided along the resin side surface 233 between the exposed region 412 located at the corner portion 241 and the exposed region 412 located at the corner portion 243 include, in the stated order, an exposed region 413, an exposed region 422, a subset of (12 in FIG. 3) exposed regions 432, another exposed region 422, and another exposed region 413. Similarly, as shown in FIG. 3, the exposed regions provided along the resin side surfaces 234 between the exposed region 412 located at the corner portion 242 and the exposed region 412 located at the corner portion 244 include, in the stated order, an exposed region 413, an exposed region 422, a subset of (12 in FIG. 3) exposed regions 432, another exposed region 422, and another exposed region 413. The exposed regions 422 and the exposed regions 432 are all equally spaced apart in the x direction. In one example, the spacing is determined to provide a pitch width ranging from 0.3 to 0.6 mm (preferably a pitch width ranging from 0.4 to 0.5 mm). The pitch width refers to a distance between any two exposed regions adjacent in the x direction, out of the exposed regions 422 and 432, measured from the mid-point of one of the two exposed regions in the x direction to the mid-point of the other exposed region in the x direction. That is, in plan view, each exposed region 422 is located near an exposed region 412 in the x direction along the resin side surface 233 or 234, and an exposed region 413 is located between the exposed region 412 and the exposed region 422 in x direction. In plan view, a subset of exposed regions 432 is located next to an exposed region 422 in the x direction at a side away from the exposed region 413.

As shown in FIGS. 1 to 3, each fourth terminal part 44 is located between two first terminal parts 41 adjacent in the y direction. The fourth terminal parts 44 include those extending from the resin side surface 231 into the resin member 2 in the x direction in plan view and those extending from the resin side surface 232 into the resin member 2 in the x direction in plan view. The fourth terminal parts 44 are exposed from the resin side surface 231 or 232. FIG. 6 shows two fourth terminal parts 44 exposed from the resin side surface 231.

Each fourth terminal part 44 has an obverse surface 441 and an exposed region 442. The obverse surface 441 and the exposed region 442 are spaced apart in the z direction and face away from each other. The obverse surface 441 faces in the z2 direction, and the exposed region 442 in the z1 direction. The obverse surface 441 has a connecting member 53 bonded thereto. As shown in FIG. 3, the exposed region 442 has a band shape extending in the x direction from the corresponding resin side surfaces 231 or 232. The exposed region 442 overlaps with the obverse surface 441 in plan view.

As shown in FIGS. 1 to 3, each fifth terminal part 45 is located between two fourth terminal parts 44 adjacent in the y direction. The fifth terminal parts 45 include those located along the resin side surface 231 in plan view to be exposed from the resin side surface 231, and those located along the resin side surface 232 in plan view to be exposed from the resin side surface 232. FIG. 2 shows an example in which 12 fifth terminal parts 45 are provided along each of the resin side surfaces 231 and 232. However, the number of the fifth terminal parts 45 provided along each of the resin side surfaces 231 and 232 is not limited to 12. The number of the fifth terminal parts 45 may range from 2 to 30, for example. Additionally, although the figure shows an example in which equal numbers of the third terminal parts 43 and the fifth terminal parts 45 provided, the numbers may be different. As above, the fifth terminal parts 45 are exposed from the resin side surface 231 or 232. FIG. 6 shows 12 fifth terminal parts 45 exposed from the resin side surface 231.

Each fifth terminal part 45 has an obverse surface 451 and an exposed region 452. The obverse surface 451 and the exposed region 452 are spaced apart in the z direction and face away from each other. The obverse surface 451 faces in the z2 direction, and the exposed region 452 in the z1 direction. The obverse surface 451 has a connecting member 54 bonded thereto. As shown in FIG. 3, the exposed region 452 has a band shape extending in the x direction from the corresponding resin side surfaces 231 or 232. The exposed region 452 overlaps with the obverse surface 451 in plan view.

As shown in FIGS. 3 and 4, each exposed region 412 is adjacent to an exposed region 414 in the y direction. The exposed region 414 is adjacent to an exposed region 442 in the y direction (at the side away from the exposed region 412). The exposed region 442 is adjacent to a subset of exposed region 452 in the y direction (at a side away from the exposed region 414). That is, as shown in FIG. 3, the exposed regions provided along the resin side surface 231 between the exposed region 412 located at the corner portion 241 and the exposed region 412 located at the corner portion 242 include, in the stated order, an exposed region 414, an exposed region 442, a subset of (12 in FIG. 3) exposed regions 452, another exposed region 442, and another exposed region 414. Similarly, as shown in FIG. 3, the exposed regions provided along the resin side surfaces 232 between the exposed region 412 located at the corner portion 243 and the exposed region 412 located at the corner portion 244 include, in the stated order, an exposed region 414, an exposed region 442, a subset of (12 in FIG. 3) exposed regions 452, another exposed region 442, and another exposed region 414. The exposed regions 442 and the exposed regions 452 are all equally spaced apart in the y direction. In one example, the spacing is determined to provide a pitch width ranging from 0.3 to 0.6 mm (prefer-ably a pitch width ranging from 0.4 to 0.5 mm). The pitch width refers to a distance between any two exposed regions adjacent in the y direction, out of the exposed regions 442 and 452, measured from the mid-point of one of the two exposed regions in the y direction to the mid-point of the other exposed region in the y direction. That is, in plan view, each exposed region 442 is located near an exposed region 412 in the y direction along the resin side surface 231 or 232, and an exposed region 414 is located between the exposed region 412 and the exposed region 442 in y direction. In plan view, a subset of exposed regions 452 is located next to an exposed region 442 in the y direction at a side away from the exposed region 414.

As shown in FIGS. 2, 7 and 8, the mount part 46 is for mounting the electronic element 1 thereon. The mount part 46 is rectangular in plan view. Each edge of the mount part 46 is parallel to either of the x and y directions in plan view. The mount part 46 is located centrally of the electronic device A1 in plan view.

As shown in FIGS. 7 and 8, the mount part 46 has an obverse surface 461 and a reverse surface 462. The obverse surface 461 and the reverse surface 462 are spaced apart in the z direction and face away from each other. The obverse surface 461 faces in the z2 direction, and the reverse surface 462 in the z1 direction. The obverse surface 461 is the side on which the electronic element 1 is placed and faces the element reverse surface 1b. The reverse surface 462 is exposed from the resin reverse surface 22. The reverse surface 462 may be covered by the resin member 2.

As shown in FIGS. 2 and 4, the connecting parts 47 are connected to the respective first terminal parts 41 and also to the mount part 46. In plan view, the connecting parts 47 extend radially away from the four corners of the mount part 46 to the first terminal parts 41.

As shown in FIG. 8, each connecting part 47 has an obverse surface 471 and a reverse surface 472. The obverse surface 471 and the reverse surface 472 are spaced apart in the z direction and face away from each other. The obverse surface 471 faces in the z2 direction, and the reverse surface 472 in the z1 direction. The reverse surface 472 is covered by the resin member 2.

As shown in FIG. 8, the lead frame 3 has the following details. The obverse surfaces 411 of the first terminal parts 41, the obverse surface 461 of the mount part 46, and the obverse surfaces 471 of the connecting parts 47 are connected and flush with each other. Also as shown in FIG. 8, the covered regions 415 of the first terminal parts 41 and the connecting parts 47 of the reverse surfaces 472 are connected and flush with each other.

The exposed regions 412 (including the main part 412a and the sub-parts 412b and 412c), 413, 414, 422, 432, 442 and 452 and also the reverse surface 462 (of the mount part 46) are flush with the resin reverse surface 22. Coatings may be applied to the exposed regions 412, 413, 414, 422, 432, 442 and 452 and the reverse surface 462. A material used for the coating has better solder wettability than the base material (such as copper) of the lead frame 3.

As shown in FIG. 4, the exposed regions 412, 413, 414, 422, 432, 442 and 452 of the lead frame 3 have the following dimensions in plan view.

In plan view, each exposed region 413 has a larger area than each of the exposed regions 412 and 422. Note that the area of the exposed region 412 in plan view is a sum of the areas of the main part 412a and the sub-parts 412b and 412c in plan view. Similarly, each exposed region 414 has a larger area than each of the exposed regions 412 and 442 in plan view. The area of the exposed region 413 in plan view is about the same as the area of the exposed region 414 in plan view.

Each exposed region 413 has an x-direction dimension Dx13 and each exposed region 422 has an x-direction dimension Dx2, satisfying that Dx13 is larger than Dx2. For example, the x-direction dimension Dx13 of each exposed region 413 is from 1.5 to 6 times larger than the x-direction dimension Dx2 of each exposed region 422. Each exposed region 414 has a y-direction dimension Dy14 and each exposed region 442 has a y-direction dimension Dy4, satisfying that Dy14 is larger than Dy4. The y-direction dimension Dy14 of each exposed region 414 is from 1.5 to 6 times larger than the y-direction dimension Dy4 of each exposed region 442.

Each exposed region 432 has an x-direction dimension Dx3 that is approximately equal to the x-direction dimension Dx2 of each exposed region 422. The x-direction dimensions Dx2 and Dx3 may be from 0.15 to 0.3 mm, for example. Each exposed region 422 has an y-direction dimension Dy2 and each exposed region 432 has a y-direction dimension Dy3, satisfying that Dy2 and Dy3 are approximately equal to each other. The y-direction dimensions Dy2 and Dy3 may be from 0.3 to 0.6 mm (more preferably from 0.4 to 0.5 mm), for example. Each exposed region 442 has an x-direction dimension Dx4, and each exposed region 452 has an x-direction dimension Dx5, satisfying that Dx4 and Dx5 are approximately equal. The x-direction dimensions Dx4 and Dx5 may be from 0.3 to 0.6 mm (more preferably from 0.4 to 0.5 mm), for example. The y-direction dimension Dy4 of each exposed region 442 is about the same as the y-direction dimension Dy5 of each exposed region 452. The y-direction dimensions Dy4 and Dy5 may be from 0.15 to 0.3 mm, for example.

The sub-part 412b of each exposed region 412 has a y-direction dimension Dy12 that is smaller than the y-direction dimension Dy2 of each exposed region 422. The sub-part 412c of each exposed region 412 has an x-direction dimension Dx12 that is smaller than the x-direction dimension Dx4 of each exposed region 442. The y-direction dimension Dy12 of each sub-part 412b is approximately equal to the x-direction dimension Dx12 of each sub-part 412c. Additionally, the main part 412a of each exposed region 412 satisfies that the x-direction dimension is approximately equal to the x-direction dimension Dx12 of the sub-part 412c, and also satisfies that the y-direction is approximately equal to the y-direction dimension Dy12 of the sub-part 412b. Also, for each exposed region 412 in plan view, the sub-part 412b and the sub-part 412c have approximately equal-sized areas.

Each of the connecting members 51 to 54 electrically connects two isolated components. The connecting members 51 to 54 may be bond wires, for example. Alternatively, the connecting members 51 to 54 may be bond ribbons or flat lead strips, depending on the specifications of the electronic device A1 or other factors. The connecting members 51 to 54 may be made of a metal including, but not limited to, a metal containing Au, a metal containing Al, or a metal containing Cu.

The connecting members 51 electrically connect a subset of the obverse-surface electrodes 11 to the second terminal parts 42. As shown in FIG. 2, each connecting member 51 is bonded at one end to an obverse-surface electrode 11 and the other end to the obverse surface 421 of a second terminal part 42.

The connecting members 52 electrically connect a subset of the obverse-surface electrodes 11 to the third terminal parts 43. As shown in FIG. 2, each connecting member 52 is bonded at one end to an obverse-surface electrode 11 and the other end to the obverse surface 431 of a third terminal part 43.

The connecting members 53 electrically connect a subset of the obverse-surface electrodes 11 to the fourth terminal parts 44. As shown in FIG. 2, each connecting member 53 is bonded at one end to an obverse-surface electrode 11 and the other end to the obverse surface 441 of a fourth terminal part 44.

The connecting members 54 electrically connect a subset of the obverse-surface electrodes 11 to the fifth terminal parts 45. As shown in FIG. 2, each connecting member 54 is bonded at one end to an obverse-surface electrode 11 and the other end to the obverse surface 451 of a fifth terminal part 45.

Figure 9:
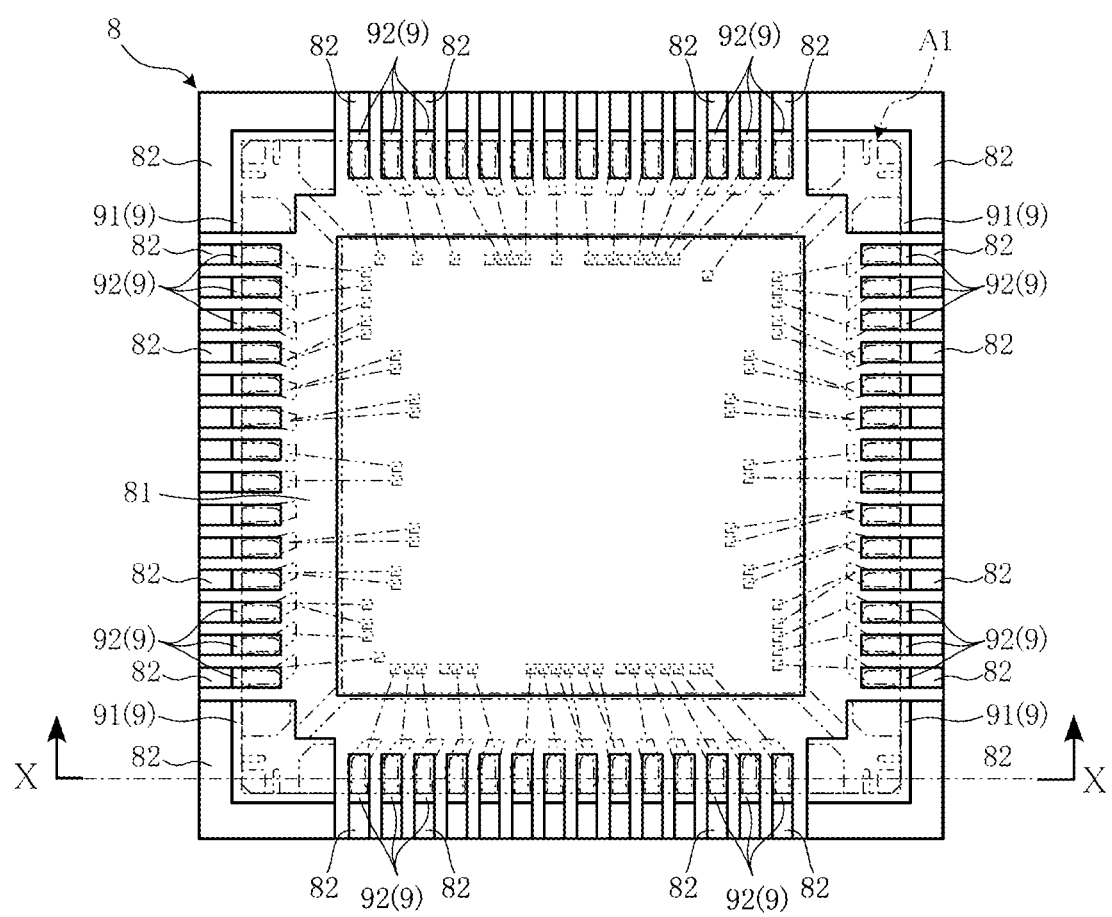
FIG. 9 is a plan view showing an assembled structure of the electronic device according to the first embodiment.
Figure 10:
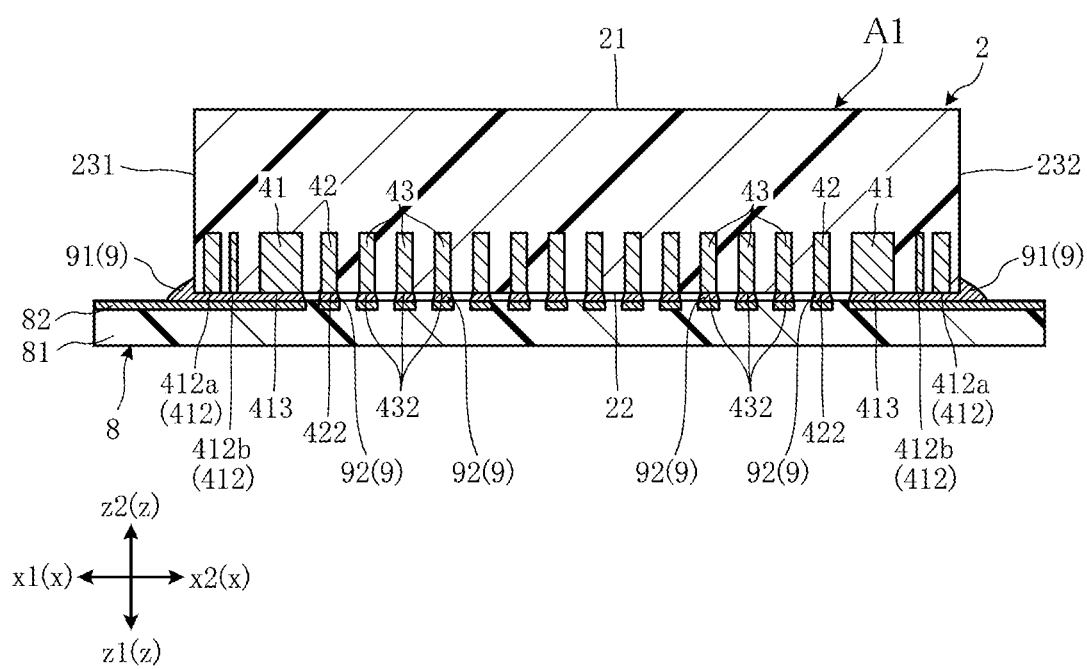
FIG. 10 is a sectional view taken along line X-X of FIG. 9.

Next, a mounting structure of the electronic device A1 is described with reference to FIGS. 9 and 10. The assembled structure of the electronic device A1 includes the electronic device A1, a circuit board 8 and a solder layer 9. FIG. 9 is a plan view of the assembled structure of the electronic device A1, with the electronic device A1 shown in phantom (chain double-dashed lines). FIG. 10 is a sectional view taken along line X-X in FIG. 9.

The circuit board 8 includes a substrate 81 and a wiring pattern 82 formed on the substrate. The substrate 81 may be formed from a glass epoxy resin, and the wiring pattern 82 may be formed from Cu. These materials are given by way of example and not by way of limitation.

The solder layer 9 is placed between the electronic device A1 and the circuit board 8. The solder layer 9 bonds the electronic device A1 to the circuit board 8.

The solder layer 9 includes a plurality of first joint segments 91 and a plurality of second joint segments 92.

Referring to FIG. 9, the first joint segments 91 are provided for the first terminal parts 41, respectively, and each first joint segment 91 is one continuous layer segment that includes a portion sandwiched between the circuit board 8 (the wiring pattern 82) and the exposed region 412, a portion sandwiched between the circuit board 8 (the wiring pattern 82) and the exposed region 413, and a portion sandwiched the circuit board 8 (the wiring pattern 82) and the exposed region 414 of the corresponding first terminal part 41. Each first joint segment 91 overlaps with the exposed regions 412, 413 and 414 and the covered region 415 of the corresponding first terminal part 41 in plan view. Each first joint segment 91 has an L-shape in plan view.

As shown in FIGS. 9 and 10, the second joint segments 92 are provided for the second terminal parts 42, the third terminal parts 43, the fourth terminal parts 44 and the fifth terminal parts 45, respectively, and each second joint segment 92 is a discrete (separated) layer segment sandwiched between the circuit board 8 (the wiring pattern 82) and a corresponding one of the exposed regions 422, 432, 442 and 452. Although FIG. 9 shows the second joint segments 92 separated from each other, this is merely an example and two or more second joint segments 92 may be provided as a continuous layer segment.

Operation and advantages of the electronic device A1 are as follows.

The electronic device A1 includes the lead frame 3 having the exposed regions 412, 413 and 422. Each exposed region 413 is located between an exposed region 412 and an exposed region 422 in the x direction. The area of the exposed region 413 in plan view is larger than the area of each of the exposed regions 412 and 422 in plan view. With this configuration, when the electronic device A1 is soldered to the circuit board 8, the exposed regions 413 are bonded to the circuit board 8. The thermal stress imposed on the solder layer 9 is therefore more distributed by the exposed regions 413. That is, the exposed regions 413 serve to mitigate the thermal stress applied to the solder layer 9 that bonds the electronic device A1 to the circuit board 8. Consequently, the electronic device A1 is enabled to reduce the risk of clacking of the solder layer 9.

The electronic device A1 includes the lead frame 3 having the exposed regions 412, 414 and 442. Each exposed region 414 is located between an exposed region 412 and an exposed region 442 in the y direction. The area of the exposed region 414 in plan view is larger than the area of each of the exposed regions 412 and 442 in plan view. With this configuration, when the electronic device A1 is soldered to the circuit board 8, the exposed regions 414 are bonded to the circuit board 8. The thermal stress imposed on the solder layer 9 is therefore more distributed by the exposed regions 414. That is, the exposed regions 414 serve to mitigate the thermal stress applied to the solder layer 9 that bonds the electronic device A1 to the circuit board 8. Consequently, the electronic device A1 is enabled to reduce the risk of clacking of the solder layer 9.

The electronic device A1 is configured such that the y-direction dimension Dy2 of the exposed regions 422 and the y-direction dimension Dy3 of the exposed regions 432 are both within the range of 0.3 to 0.6 mm (more preferably within the range of 0.4 to 0.5 mm). The research by the present inventor shows that the thermal stress applied to the second terminal parts 42 and the third terminal parts 43 will be reduced by increasing the y-direction dimensions Dy2 and Dy3. However, the y-direction dimension of the electronic device A1 will be also increased by increasing the y-direction dimensions Dy2 and Dy3. The y-direction dimensions Dy2 and Dy3 ranging from 0.3 to 0.6 mm (more preferably, from 0.4 to 0.5 mm) are found appropriate for reducing the thermal stress applied to the second terminal parts 42 and the third terminal parts 43, without substantially increasing the y-direction dimension of the electronic device A1. In this way, the electronic device A1 is configured to reduce the risk of clacking of the solder layer 9, without substantially increasing the y-direction dimension of the electronic device A1.

The electronic device A1 is configured such that the x-direction dimension Dx4 of the exposed regions 442 and the x-direction dimension Dx5 of the exposed regions 452 are both within the range of 0.3 to 0.6 mm (more preferably within the range of 0.4 to 0.5 mm). The research by the present inventor shows that the thermal stress applied to the fourth terminal parts 44 and the fifth terminal parts 45 will be reduced by increasing the x-direction dimensions Dx4 and Dx5. However, the x-direction dimension of the electronic device A1 will be also increased by increasing the x-direction dimensions Dx4 and Dx5. The x-direction dimensions Dx4 and Dx5 ranging from 0.3 to 0.6 mm (more preferably, from 0.4 to 0.5 mm) are found appropriate for reducing the thermal stress applied to the fourth terminal parts 44 and the fifth terminal parts 45, without substantially increasing the x-direction dimension of the electronic device A1. In this way, the electronic device A1 is configured to reduce the risk of clacking of the solder layer 9, without substantially increasing the x-direction dimension of the electronic device A1.

Figure 11:
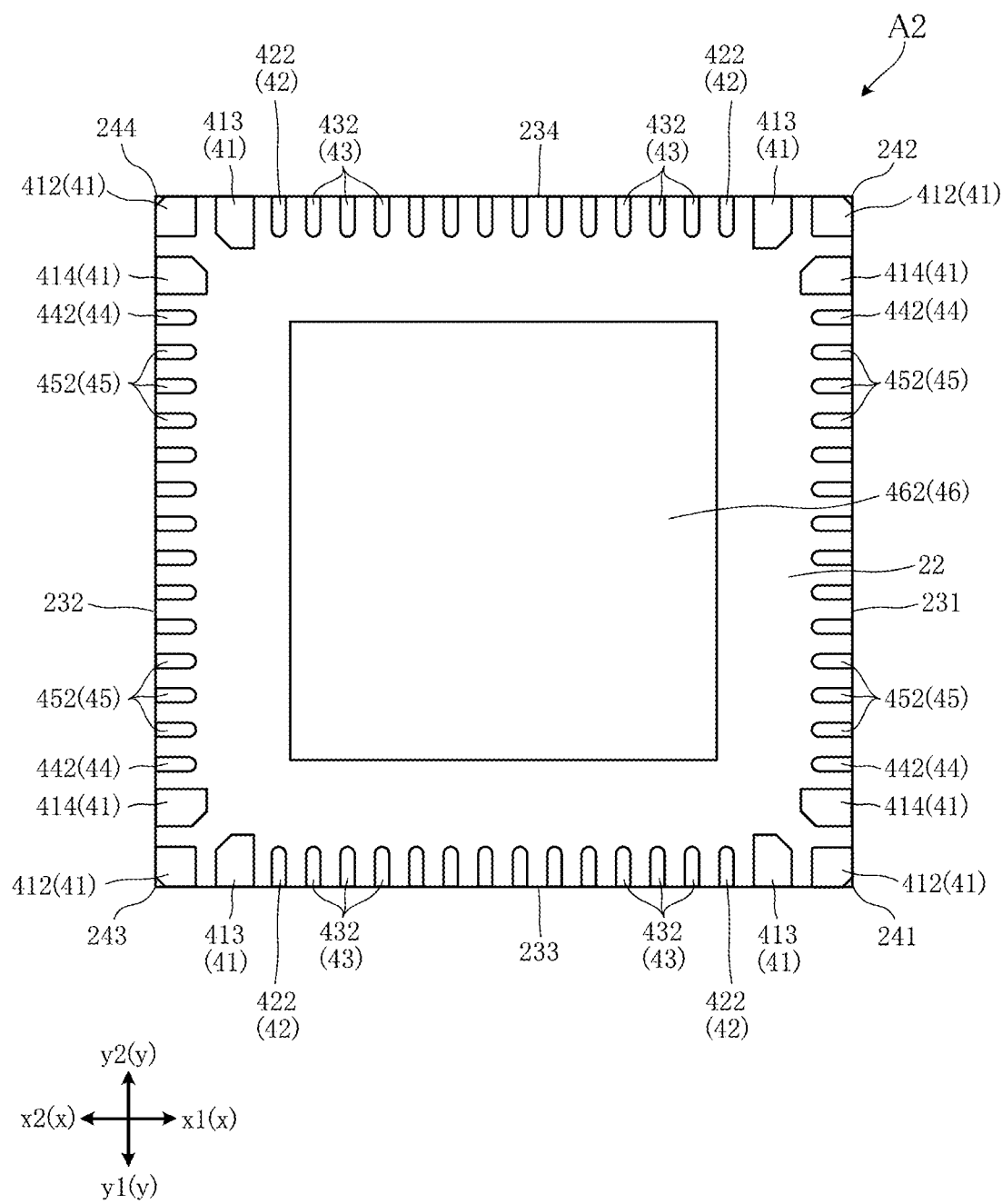
FIG. 11 is a bottom view of an electronic device according to a second embodiment.
Figure 12:
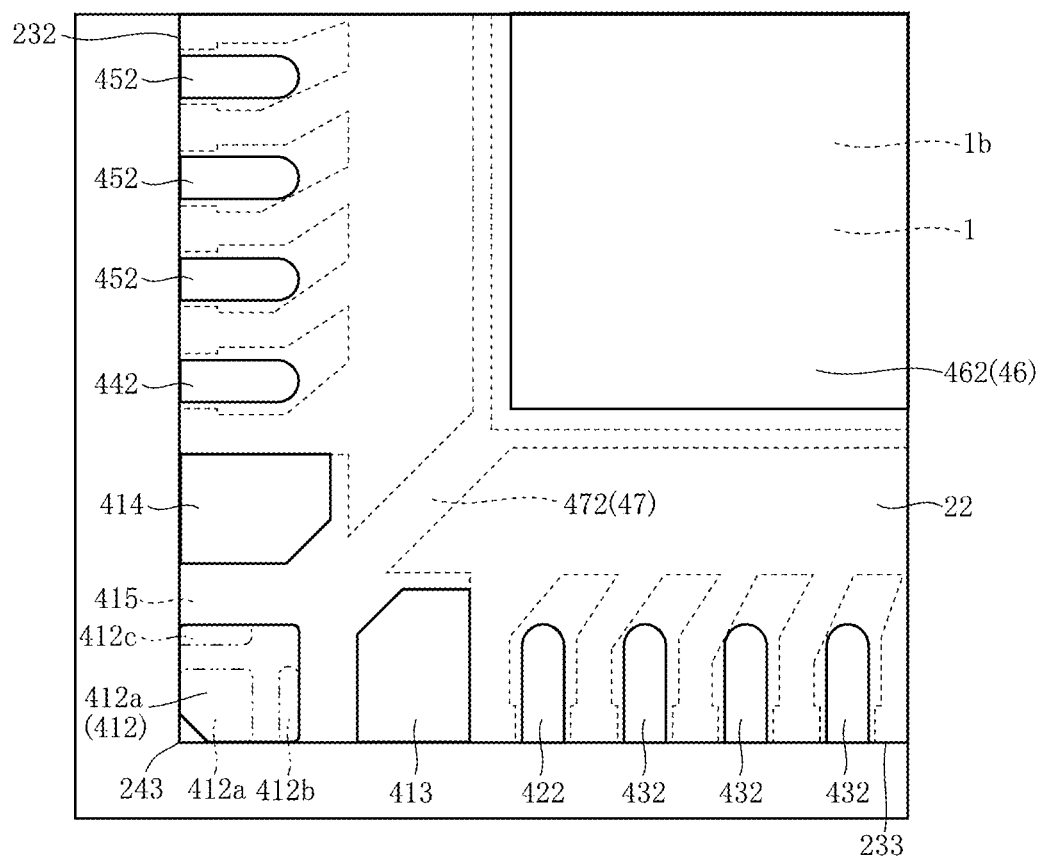
FIG. 12 is an enlarged view showing a portion of FIG. 11.

FIGS. 11 and 12 show an electronic device A2 according to a second embodiment. FIG. 11 is a bottom view of the electronic device A2. FIG. 12 is an enlarged view showing a portion of FIG. 11. Unlike the electronic device A1, the electronic device A2 includes exposed regions 412 each of which is composed only of a main part 412a. That is, the exposed regions 412 of the electronic device A2 is not provided with the pair of sub-parts 412b and 412. For convenience, FIG. 12 shows the exposed region 412 of the electronic device A1 (the main part 412a and the pair of sub-parts 412b and 412c) in phantom (chain double-dashed lines).

The main part 412a of the exposed region 412 of the electronic device A2 covers a region corresponding to the main part 412a and the pair of sub-parts 412b and 412c included in the exposed region 412 of the electronic device A1.

Similarly to the electronic device A1, the electronic device A2 includes the lead frame 3 having the exposed regions 413. The electronic device A2 can therefore achieve the same advantage as the electronic device A1. That is, the thermal stress applied to the solder layer 9 is reduced by the exposed regions 413. Similarly to the electronic device A1, the electronic device A2 includes the lead frame 3 having the exposed regions 414. The electronic device A2 can therefore achieve the same advantage as the electronic device A1. That is, the thermal stress applied to the solder layer 9 is reduced by the exposed regions 414.

Figure 13:
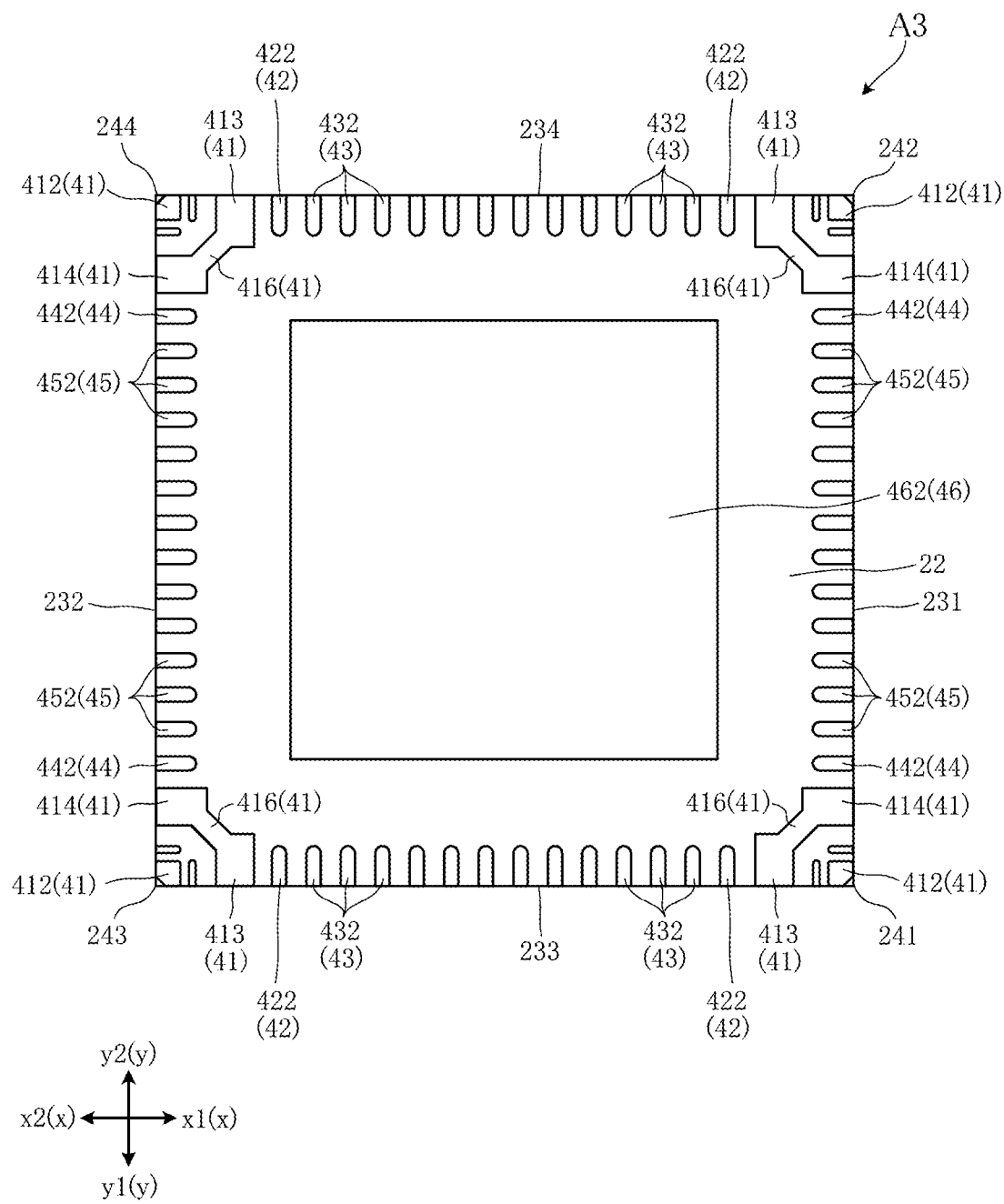
FIG. 13 is a bottom view of an electronic device according to a third embodiment.
Figure 14:
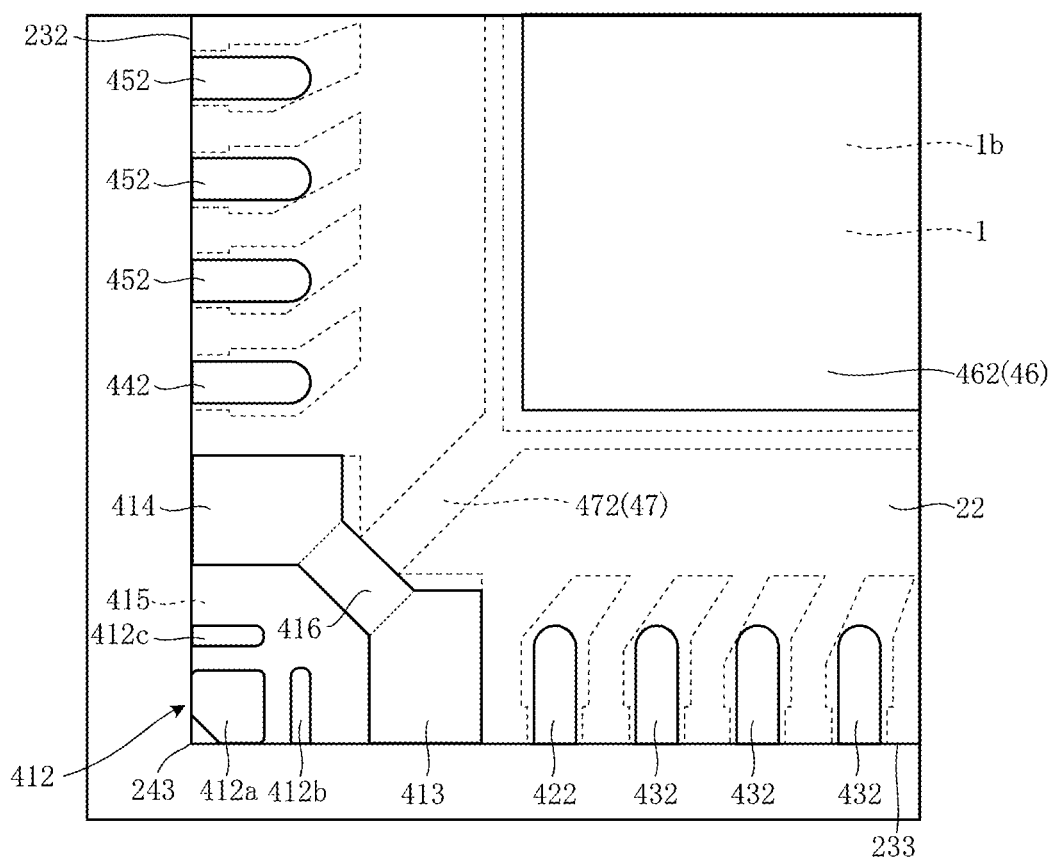
FIG. 14 is an enlarged view showing a portion of FIG. 13.
Figure 14:
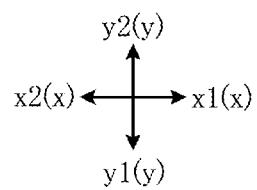

FIGS. 13 and 14 show an electronic device A3 according to a third embodiment. FIG. 13 is a bottom view of the electronic device A3. FIG. 14 is an enlarged view showing a portion of FIG. 13. The electronic device A3 differs from the electronic device A1 in that the exposed regions 413 and 414 located at the opposite sides of each exposed region 412 are connected to each other.

In addition, each first terminal part 41 of the electronic device A3 includes an exposed region 416 as shown in FIGS. 13 and 14. The exposed region 416 is a flat surface facing in the z1 direction. The exposed region 416 is connected to the exposed region 413 and the exposed region 414. In other words, the exposed region 413 and the exposed region 414 are connected by the exposed region 416. The exposed regions 413, 414 and 416 are flush with each other.

Similarly to the electronic device A1, the electronic device A3 includes the lead frame 3 having the exposed regions 413. The electronic device A3 can therefore achieve the same advantage as the electronic device A1. That is, the thermal stress applied to the solder layer 9 is reduced by the exposed regions 413. Similarly to the electronic device A1, the electronic device A3 includes the lead frame 3 having the exposed regions 414. The electronic device A3 can therefore achieve the same advantage as the electronic device A1. That is, the thermal stress applied to the solder layer 9 is reduced by the exposed regions 414.

Figure 15:
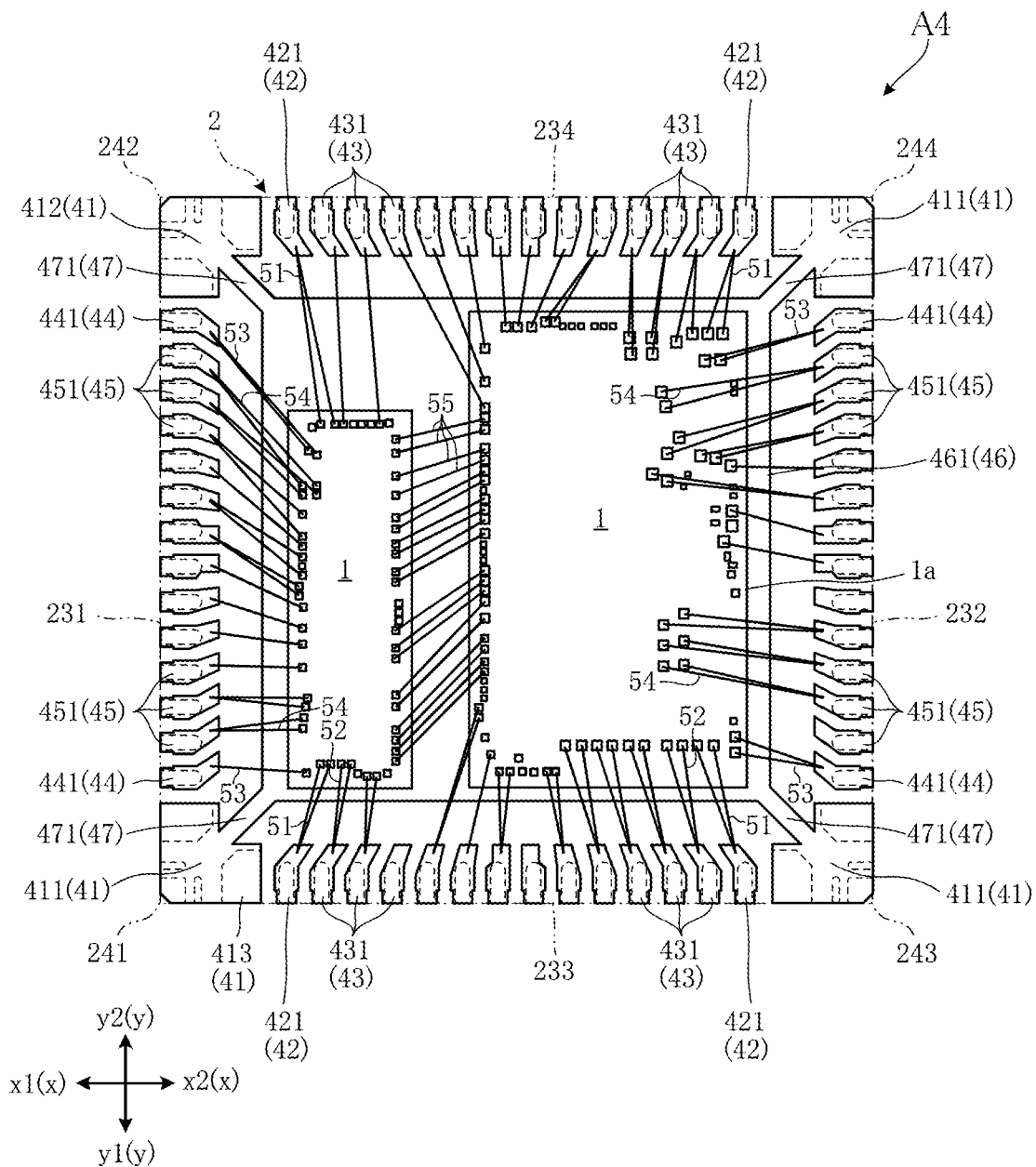
FIG. 15 is a plan view of an electronic device according to a fourth embodiment.

FIG. 15 shows an electronic device A4 according to a fourth embodiment. FIG. 15 is a plan view of the electronic device A4, with the resin member 2 shown in phantom (chain double-dashed lines). Unlike the electronic device A1, the electronic device A4 includes a plurality of electronic elements 1. In the example shown in FIG. 15, two electronic elements 1 are included.

In the example shown in FIG. 15, the two electronic elements 1 are of different sizes in plan view. The sizes of the plurality of electronic elements 1 to be included may be the same or different in plan view. In this example, the smaller electronic element 1 may be a control IC, such as a DC/DC converter, and the larger electronic element 1 may be a power supply control IC. The electronic elements 1 are not limited to the specific ICs mentioned above and may alternately be discrete elements. In this example, the two electronic elements 1 are adjacent in the x direction. Alternatively, they may be adjacent in the y direction.

As shown in FIG. 15, the electronic device A4 additionally includes a plurality of connecting members 55. Each connecting member 55 electrically connects an obverse-surface electrode 11 of one of the two electronic element 1 to an obverse-surface electrode 11 of the other electronic element 1. Like the connecting members 51 to 54, the connecting members 55 may be bond wires, for example. Alternatively, the connecting members 55 may be bond ribbons or flat lead strips. The connecting members 55 may be made of a metal including, but not limited to, a metal containing Au, a metal containing A1, or a metal containing Cu. The connecting members 55 may be omitted when electrical connections between the electronic elements 1 are not necessary.

Similarly to the electronic device A1, the electronic device A4 includes the lead frame 3 having the exposed regions 413. The electronic device A4 can therefore achieve the same advantage as the electronic device A1. That is, the thermal stress applied to the solder layer 9 is reduced by the exposed regions 413. Similarly to the electronic device A1, the electronic device A4 includes the lead frame 3 having the exposed regions 414. The electronic device A4 can therefore achieve the same advantage as the electronic device A1. That is, the thermal stress applied to the solder layer 9 is reduced by the exposed regions 414.

Figure 16:
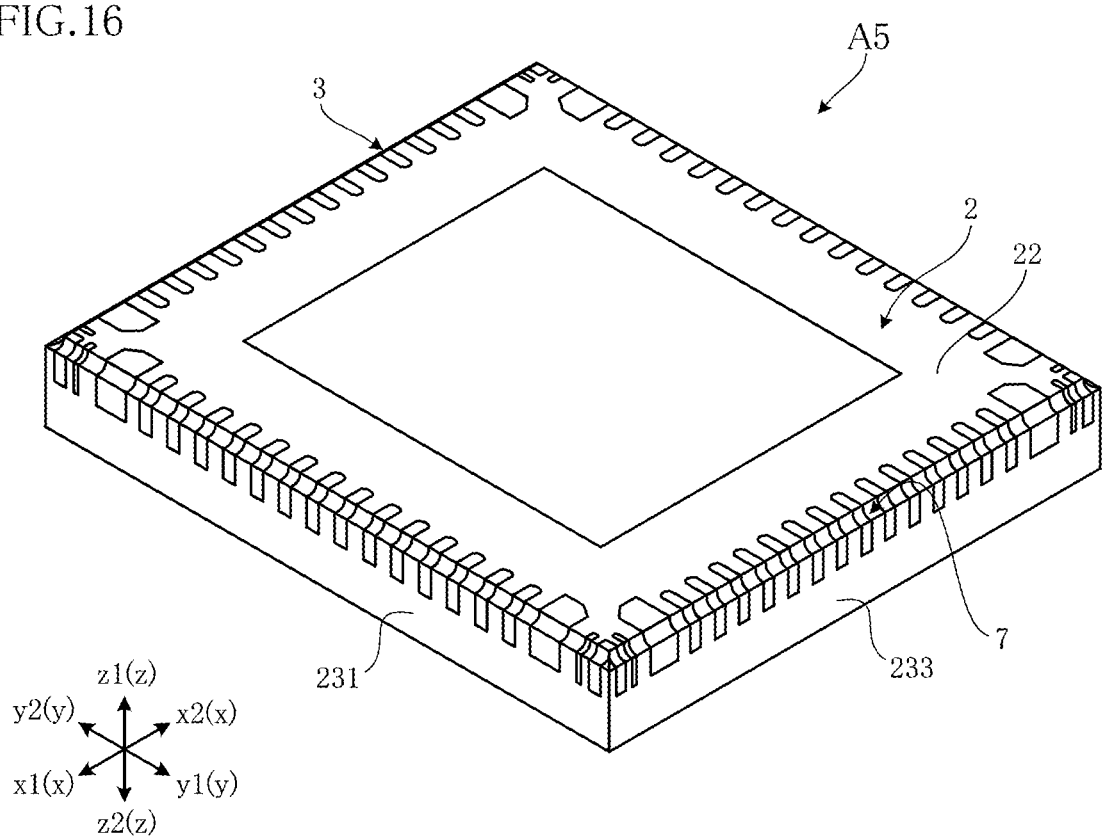
FIG. 16 is a perspective view of an electronic device according to a fifth embodiment.
Figure 17:
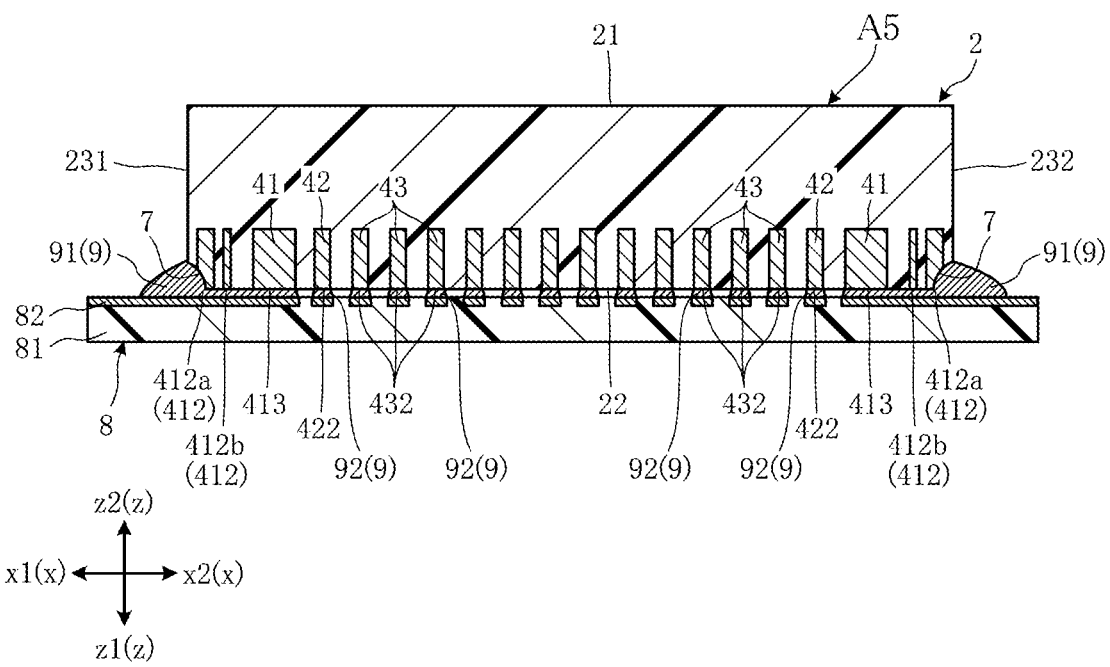
FIG. 17 is a sectional view showing an assembled structure of the electronic device according to the fifth embodiment.

FIGS. 16 and 17 show an electronic device A5 according to a fifth embodiment. FIG. 16 is a perspective view of the electronic device A5 as seen from the bottom. FIG. 17 is a sectional view of the assembled structure of the electronic device A5. The cross section shown in FIG. 17 corresponds to the cross section shown in FIG. 10 for the first embodiment. Unlike the electronic device A1, the electronic device A5 is provided with a recess 7 formed around the periphery of the bottom surface.

The recess 7 is recessed from the side surfaces and also from the bottom surface of the electronic device A5. The recess 7 extends continuously around the periphery of the electronic device A5 in plan view. The is, the recess 7 is formed partly on the resin member 2 and partly on the terminal parts (the first to fifth terminal parts 41, 42, 43, 44 ad 45) of the lead frame 3.

Similarly to the electronic device A1, the electronic device A5 includes the lead frame 3 having the exposed regions 413. The electronic device A5 can therefore achieve the same advantage as the electronic device A1. That is, the thermal stress applied to the solder layer 9 is reduced by the exposed regions 413. Similarly to the electronic device A1, in addition, the electronic device A5 includes the lead frame 3 having the exposed regions 414. The electronic device A5 can therefore achieve the same advantage as the electronic device A1. That is, the thermal stress applied to the solder layer 9 is reduced by the exposed regions 414.

The electronic device A5 is provided with the recess 7. The recess 7 enhances the solder wettability, so that fillets will be formed from the solder layer 9 more reliably. Solder fillets enable visual inspection of the soldering conditions of the electronic device A5, which is of a leadless package.

The electronic devices A1 to A5 according to the first to fifth embodiments can be modified by replacing the lead frame 3 with a conductive bord composed of an insulative substrate and a wiring layer formed on the insulative substrate. The insulative substrate may be made from an electrically insulating material including, but not limited to, a highly thermal conductive ceramic material, a resin material generally used for printed circuit boards, or silicon. The wiring layer may be made from an electrically conductive material including, but not limited to, a metal containing Cu or A1. In such a modification, the exposed regions 412, 422, 432, 442 and 452 are formed on the wiring layer.

The electronic devices and the assembled structures of the electronic devices according to the present disclosure are not limited to the embodiments described above. Various design changes can be made to the specific configurations of the components of the electronic devices and the assembled structures of the electronic devices according to the present disclosure.

The electronic devices and the assembled structures of the electronic devices according to the present disclosure include the embodiments according to the following clauses.

Clause 1

An electronic device comprising:
an electronic element having an element obverse surface and an element reverse surface spaced apart from each other in a first direction, the element obverse surface being provided with an obverse-surface electrode;
a resin member having a resin reverse surface facing in a same direction as the element reverse surface, the resin member covering the electronic element; and
an electrically conductive member supporting the electronic element and electrically connected to the electronic element,
wherein the electrically conductive member has a first exposed region, a second exposed region and a third exposed region each of which is exposed from the resin reverse surface,
the resin member has a first resin side surface and a second resin side surface connected to each other and standing up from the resin reverse surface,
as viewed in the first direction, the first exposed region is located at a corner portion where the first resin side surface and the second resin side surface are connected,
as viewed in the first direction, the second exposed region is located side by side with the first exposed region in a second direction extending along the first resin side surface,
the third exposed region is located between the first exposed region and the second exposed region in the second direction, and
as viewed in the first direction, the third exposed region has a larger area than each of the first exposed region and the second exposed region.

Clause 2

The electronic device according to Clause 1, wherein the electrically conductive member includes a first terminal part having the first exposed region and the third exposed region, and
the first terminal part has a covered region that is covered by the resin member and located between the first exposed region and the second exposed region as viewed in the first direction.

Clause 3

The electronic device according to Clause 2, further comprising a first connecting member covered by the resin member,
wherein the electrically conductive member includes a second terminal part that provides the second exposed region and is spaced apart from the first terminal part, and the first connecting member electrically connects the obverse-surface electrode and the second terminal part.

Clause 4

The electronic device according to Clause 3, wherein the electrically conductive member includes a mount part on which the electronic element is mounted and a connecting part extending from the mount part to the first terminal part, and the connecting part is covered by the resin member.

Clause 5

The electronic device according to Clause 4, wherein the mount part has a mount-part obverse surface facing the element reverse surface, the first terminal part has a first-terminal-part obverse surface facing in a same direction as the mount-part obverse surface, the connecting part has a connecting-part obverse surface facing in a same direction as the mount-part obverse surface, and the mount-part obverse surface, the first-terminal-part obverse surface and the connecting-part obverse surface are flush with each other.

Clause 6

The electronic device according to any one of Clauses 2 to 5, wherein the electrically conductive member has a fourth exposed region exposed from the resin reverse surface, and as viewed in the first direction, the fourth exposed region is located in the second direction from the second exposed region and located at a side of the second exposed region away from the third exposed region in the second direction.

Clause 7

The electronic device according to Clause 6, further comprising a second connecting member covered by the resin member, wherein the electrically conductive member includes a third terminal part providing the fourth exposed region, and the second connecting member electrically connects the obverse-surface electrode and the third terminal part.

Clause 8

The electronic device according to any one of Clauses 2 to 7, wherein the first terminal part is electrically isolated from the obverse-surface electrode.

Clause 9

The electronic device according to any one of Clauses 1 to 8, wherein the third exposed region in the second direction is greater in dimension than the second exposed region in the second direction.

Clause 10

The electronic device according to Clause 9, wherein the third exposed region in the second direction is from 1.5 to six times greater in dimension than the second exposed region in the second direction.

Clause 11

The electronic device according to any one of Clauses 1 to 10, wherein the third exposed region is greater in dimension along an orthogonal direction perpendicular to the first direction and the second direction than the second exposed region.

Clause 12

The electronic device according to Clause 11, wherein the third exposed region is greater in dimension along the orthogonal direction than the first exposed region.

Clause 13

The electronic device according to any one of Clauses 2 to 12, further comprising a fifth exposed region and a sixth exposed region each of which is exposed from the resin reverse surface, wherein as viewed in the first direction, the fifth exposed region is located side by side with the first exposed region in a third direction extending along the second resin side surface, the sixth exposed region is located between the first exposed region and the fifth exposed region in the third direction, and as viewed in the first direction, the sixth exposed region has a larger area than each of the first exposed region and the fifth exposed region.

Clause 14

The electronic device according to Clause 13, wherein the first terminal part provides the sixth exposed region, and as viewed in the first direction, the covered region is located between the first exposed region and the sixth exposed region.

Clause 15

The electronic device according to Clause 14, further comprising a third connecting member covered by the resin member, wherein the electrically conductive member includes a fourth terminal part providing the fifth exposed region, and the third connecting member electrically connects the obverse-surface electrode and the fourth terminal part.

Clause 16

The electronic device according to Clause 14 or 15, wherein the electrically conductive member has a seventh exposed region exposed from the resin reverse surface, and as viewed in the first direction, the seventh exposed region is located in the third direction from the fifth exposed region and located at a side of the fifth exposed region away the sixth exposed region in the third direction.

Clause 17

The electronic device according to Clause 16, further comprising a fourth connecting member covered by the resin member, wherein the electrically conductive member includes a fifth terminal part providing the seventh exposed region, and the fourth connecting member electrically connects the obverse-surface electrode and the fifth terminal part.

Clause 18

The electronic device according to any one of Clauses 13 to 17, wherein the third direction is perpendicular to the first direction and the second direction.

Clause 19

The electronic device according to any one of Clauses 13 to 18, wherein the first exposed region includes a main part and a pair of sub-parts separated from each other and also from the main part, the main part is rectangular as viewed in the first direction, one of the pair of sub-parts is located between the third exposed region and the main part in the second direction, and the other one of the pair of sub-parts is located between the sixth exposed region and the main part in the third direction.

Clause 20

A mounting structure of an electronic device comprising:
an electronic device according to any one of Clauses 13 to 19;
a circuit board; and
a solder layer bonding the electronic device and the circuit board,
wherein the solder layer is a continuous layer having a portion sandwiched between the circuit board and the first exposed region, a portion sandwiched between the circuit board and the third exposed region, and a portion sandwiched the circuit board and the sixth exposed region.

Reference Signs

A1-A5: Electronic device
1: Electronic element
1a: Element obverse surface
1b: Element reverse surface
11: Obverse-surface electrode
2: Resin member
21: Resin obverse surface
22: Resin reverse surface
231-234: Resin side surface
241-244: Corner portion
3: Lead frame
41: First terminal part
411: Obverse surface
412: Exposed region
412a: Main part
412b, 412c: Sub-part
413: Exposed region
414: Exposed region
415: Covered region
416: Exposed region
42: Second terminal part
421: Obverse surface
422: Exposed region
43: Third terminal part
431: Obverse surface
432: Exposed region
44: Fourth terminal part
441: Obverse surface
442: Exposed region
45: Fifth terminal part
451: Obverse surface
452: Exposed region
46: Mount part
461: Obverse surface
462: Reverse surface
47: Connecting part
471: Obverse surface
472: Reverse surface
51-55: Connecting member
7: Recess
8: Circuit board; and
81: Substrate
82: Wiring pattern
9: Solder layer
91: First joint segment
92: Second joint segment

The invention claimed is:

1. An electronic device comprising:
an electronic element having an element obverse surface and an element reverse surface spaced apart from each other in a first direction, the element obverse surface being provided with an obverse-surface electrode;
a resin member having a resin reverse surface facing in a same direction as the element reverse surface, the resin member covering the electronic element; and
an electrically conductive member supporting the electronic element and electrically connected to the electronic element,
wherein the electrically conductive member has a first exposed region, a second exposed region, a third exposed region, a sixth exposed region, and an intermediate exposed region, each of which is exposed from the resin reverse surface,
the resin member has a first resin side surface and a second resin side surface connected to each other and standing up from the resin reverse surface,
as viewed in the first direction, the first exposed region is located at a corner portion where the first resin side surface and the second resin side surface are connected,
as viewed in the first direction, the second exposed region is located side by side with the first exposed region in a second direction extending along the first resin side surface,
the third exposed region is located between the first exposed region and the second exposed region in the second direction,
as viewed in the first direction, the third exposed region has a larger area than each of the first exposed region and the second exposed region,
the sixth exposed region is located side by side with the first exposed region in a third direction extending along the second resin side surface, and
the third exposed region and the sixth exposed region are connected by the intermediate exposed region.

2. The electronic device according to claim 1, wherein the electrically conductive member includes a first terminal part having the first exposed region and the third exposed region, and
the first terminal part has a covered region that is covered by the resin member and located between the first exposed region and the second exposed region as viewed in the first direction.

3. The electronic device according to claim 2, further comprising a first connecting member covered by the resin member,
   wherein the electrically conductive member includes a second terminal part that provides the second exposed region and is spaced apart from the first terminal part, and
   the first connecting member electrically connects the obverse-surface electrode and the second terminal part.

4. The electronic device according to claim 3, wherein the electrically conductive member includes a mount part on which the electronic element is mounted and a connecting part extending from the mount part to the first terminal part, and
   the connecting part is covered by the resin member.

5. The electronic device according to claim 4, wherein the mount part has a mount-part obverse surface facing the element reverse surface,
   the first terminal part has a first-terminal-part obverse surface facing in a same direction as the mount-part obverse surface,
   the connecting part has a connecting-part obverse surface facing in a same direction as the mount-part obverse surface, and
   the mount-part obverse surface, the first-terminal-part obverse surface and the connecting-part obverse surface are flush with each other.

6. The electronic device according to claim 2, wherein the electrically conductive member has a fourth exposed region exposed from the resin reverse surface, and
   as viewed in the first direction, the fourth exposed region is located in the second direction from the second exposed region and located at a side of the second exposed region away from the third exposed region in the second direction.

7. The electronic device according to claim 6, further comprising a second connecting member covered by the resin member,
   wherein the electrically conductive member includes a third terminal part providing the fourth exposed region, and
   the second connecting member electrically connects the obverse-surface electrode and the third terminal part.

8. The electronic device according to claim 2, wherein the first terminal part is electrically isolated from the obverse-surface electrode.

9. The electronic device according to claim 1, wherein the third exposed region in the second direction is greater in dimension than the second exposed region in the second direction.

10. The electronic device according to claim 9, wherein the third exposed region in the second direction is from 1.5 to six times greater in dimension than the second exposed region in the second direction.

11. The electronic device according to claim 1, wherein the third exposed region is greater in dimension along an orthogonal direction perpendicular to the first direction and the second direction than the second exposed region.

12. The electronic device according to claim 11, wherein the third exposed region is greater in dimension along the orthogonal direction than the first exposed region.

13. The electronic device according to claim 2, further comprising a fifth exposed region which is exposed from the resin reverse surface,
   wherein as viewed in the first direction, the fifth exposed region is located side by side with the first exposed region in the third direction,
   the sixth exposed region is located between the first exposed region and the fifth exposed region in the third direction and
   as viewed in the first direction, the sixth exposed region has a larger area than each of the first exposed region and the fifth exposed region.

14. The electronic device according to claim 13, wherein the first terminal part has the sixth exposed region, and
   as viewed in the first direction, the covered region is located between the first exposed region and the sixth exposed region.

15. The electronic device according to claim 14, further comprising a third connecting member covered by the resin member,
   wherein the electrically conductive member includes a fourth terminal part providing the fifth exposed region, and
   the third connecting member electrically connects the obverse-surface electrode and the fourth terminal part.

16. The electronic device according to claim 14, wherein the electrically conductive member has a seventh exposed region exposed from the resin reverse surface, and
   as viewed in the first direction, the seventh exposed region is located in the third direction from the fifth exposed region and located at a side of the fifth exposed region away the sixth exposed region in the third direction.

17. The electronic device according to claim 16, further comprising a fourth connecting member covered by the resin member,
   wherein the electrically conductive member includes a fifth terminal part providing the seventh exposed region, and
   the fourth connecting member electrically connects the obverse-surface electrode and the fifth terminal part.

18. The electronic device according to claim 13, wherein the third direction is perpendicular to the first direction and the second direction.

19. The electronic device according to claim 13, wherein the first exposed region includes a main part and a pair of sub-parts separated from each other and also from the main part,
   the main part is rectangular as viewed in the first direction,
   one of the pair of sub-parts is located between the third exposed region and the main part in the second direction, and
   the other one of the pair of sub-parts is located between the sixth exposed region and the main part in the third direction.

20. A mounting structure of an electronic device comprising:
   an electronic device according to claim 13;
   a circuit board; and
   a solder layer bonding the electronic device and the circuit board,
   wherein the solder layer is a continuous layer having a portion sandwiched between the circuit board and the first exposed region, a portion sandwiched between the circuit board and the third exposed region, and a portion sandwiched the circuit board and the sixth exposed region.

* * * * *